US008606136B2

(12) United States Patent
Shimura et al.

(10) Patent No.: US 8,606,136 B2
(45) Date of Patent: Dec. 10, 2013

(54) VOLTAGE DETECTION DEVICE AND IMAGE HEATING DEVICE

(75) Inventors: Yasuhiro Shimura, Yokohama (JP); Yuji Fujiwara, Susono (JP)

(73) Assignee: Canon Kabushiki Kaisha, Tokyo (JP)

( * ) Notice: Subject to any disclaimer, the term of this patent is extended or adjusted under 35 U.S.C. 154(b) by 275 days.

(21) Appl. No.: 13/093,231

(22) Filed: Apr. 25, 2011

(65) Prior Publication Data

US 2011/0280597 A1    Nov. 17, 2011

(30) Foreign Application Priority Data

May 12, 2010 (JP) ................................. 2010-110520
Apr. 13, 2011 (JP) ................................. 2011-089378

(51) Int. Cl.
*G03G 15/00* (2006.01)
*G03G 15/20* (2006.01)

(52) U.S. Cl.
USPC ............................................. 399/67; 399/88

(58) Field of Classification Search
USPC ............................................. 399/67, 69, 88
See application file for complete search history.

(56) References Cited

U.S. PATENT DOCUMENTS

| | | | |
|---|---|---|---|
| 4,845,607 A | 7/1989 | Nakao et al. | |
| 5,229,577 A | 7/1993 | Matsuura et al. | |
| 6,947,683 B2 | 9/2005 | Na | |
| 7,271,579 B2 | 9/2007 | Shimada et al. | |
| 7,277,651 B2 * | 10/2007 | Hanamoto et al. | 399/69 |
| 7,630,662 B2 | 12/2009 | Namiki et al. | |
| 8,285,158 B2 * | 10/2012 | Aiko | 399/37 |
| 2004/0004853 A1 | 1/2004 | Na | |
| 2004/0179874 A1 | 9/2004 | Kinouchi et al. | |
| 2005/0151567 A1 | 7/2005 | Shimada et al. | |
| 2008/0193150 A1 * | 8/2008 | Matsumoto | 399/31 |
| 2010/0310267 A1 | 12/2010 | Shimura et al. | |

(Continued)

FOREIGN PATENT DOCUMENTS

| | | |
|---|---|---|
| CN | 1469209 A | 1/2004 |
| CN | 1623095 A | 6/2005 |

(Continued)

OTHER PUBLICATIONS

European Search Report dated Oct. 11, 2011, in counterpart European Application No. 11164729.3-2209.

(Continued)

*Primary Examiner* — David Gray
*Assistant Examiner* — Gregory H Curran
(74) *Attorney, Agent, or Firm* — Fitzpatrick, Cella, Harper & Scinto

(57) ABSTRACT

The voltage detection device includes a first voltage detection part for detecting whether or not a time period ratio during which a voltage of an AC power supply is equal to or larger than a first threshold value is equal to or larger than a first ratio and a second voltage detection part for detecting whether or not a time period ratio during which the voltage of the AC power supply is lower than the first threshold value and equal to or larger than a second threshold value is equal to or larger than a second ratio higher than the first ratio, and determines whether the voltage of the AC power supply is a first commercial voltage or a second commercial voltage lower than the first commercial voltage based on results obtained by the first voltage detection part and by the second voltage detection part.

19 Claims, 15 Drawing Sheets

(56) References Cited

U.S. PATENT DOCUMENTS

| | | | |
|---|---|---|---|
| 2011/0148319 A1 | 6/2011 | Terazawa | |
| 2011/0280596 A1* | 11/2011 | Shimura | 399/33 |
| 2012/0000897 A1* | 1/2012 | Shimura | 219/216 |

FOREIGN PATENT DOCUMENTS

| | | |
|---|---|---|
| JP | 05-030729 | 2/1993 |
| JP | 07-199702 | 8/1995 |
| JP | 3919670 | 2/2007 |
| JP | 2007-212503 | 8/2007 |
| WO | 2010/023817 A1 | 3/2010 |

OTHER PUBLICATIONS

Chinese Office Action dated May 6, 2013, in counterpart Chinese Application No. 201110121583.X, and English-language translation thereof.

* cited by examiner

VOLTAGE WAVE FORM WITH EFFECTIVE VOLTAGE VALUE 127V
(MAXIMUM VOLTAGE IN LOW VOLTAGE RANGE ON THE SPECIFICATION)

| | | VOLTAGE DETECTION CIRCUIT 301 (VOLT 1) | VOLTAGE DETECTION CIRCUIT 302 (VOLT 2) |
|---|---|---|---|
| FIG.4A | ISOSCELES TRIANGLE WAVE WAVE HEIGHT RATIO(=√3) Vpk220V | t1/T = 0 (t1/T) < FIRST THRESHOLD RATIO(=0.35), an output is determined as 100V | t2/T = 0.28 (t2/T) < SECOND THRESHOLD RATIO(=0.7), an output is determined as 100V |
| FIG.4B | SINE WAVE WAVE HEIGHT RATIO(=√2) Vpk180V | t1/T = 0 (t1/T) < FIRST THRESHOLD RATIO(=0.35), an output is determined as 100V | t2/T = 0.30 (t2/T) < SECOND THRESHOLD RATIO(=0.7), An output is determined as 100V |
| FIG.4C | SQUARE PULSE WAVE WAVE HEIGHT RATIO(=1) Vpk127V | t1/T = 0 (t1/T) < FIRST THRESHOLD RATIO(=0.35), an output is determined as 100V | t2/T = 0 (t2/T) < SECOND THRESHOLD RATIO(=0.7), an output is determined as 100V |
| FIG.4D | SQUARE PULSE WAVE WAVE HEIGHT RATIO(=√1.58) Vpk160V | t1/T = 0 (t1/T) < FIRST THRESHOLD RATIO(=0.35), an output is determined as 100V | T2/T = 0.63 (t2/T) < SECOND THRESHOLD RATIO(=0.7), an output is determined as 100V |
| FIG.4E | SQUARE PULSE WAVE WAVE HEIGHT RATIO(=√3) Vpk220V | T1/T = 0.33 (t1/T) < FIRST THRESHOLD RATIO(=0.35), an output is determined as 100V | T2/T = 0.33 (t2/T) < SECOND THRESHOLD RATIO(=0.7), an output is determined as 100V |

VOLTAGE WAVE FORM WITH EFFECTIVE VOLTAGE VALUE 200V
(MAXIMUM VOLTAGE IN HIGH VOLTAGE RANGE ON THE SPECIFICATION)

| | VOLTAGE DETECTION CIRCUIT 301 (VOLT 1) | VOLTAGE DETECTION CIRCUIT 302 (VOLT 2) |
|---|---|---|
| FIG.5A 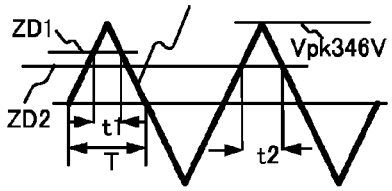 ISOSCELES TRIANGLE WAVE WAVE HEIGHT RATIO(=√3) | t1/T = 0.36<br><br>(t1/T) > FIRST THRESHOLD RATIO(=0.35), an output is determined as 200V | t2/T = 0.54<br><br>(t2/T) < SECOND THRESHOLD RATIO(=0.7), an output is determined as 100V |
| FIG.5B 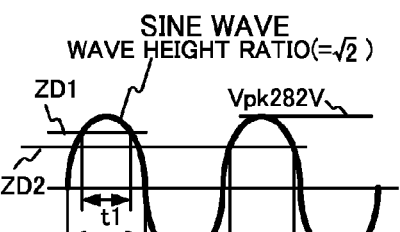 SINE WAVE WAVE HEIGHT RATIO(=√2) | t1/T = 0.43<br><br>(t1/T) > FIRST THRESHOLD RATIO(=0.35), an output is determined as 200V | T2/T = 0.61<br><br>(t2/T) > SECOND THRESHOLD RATIO(=0.7), an output is determined as 200V |
| FIG.5C 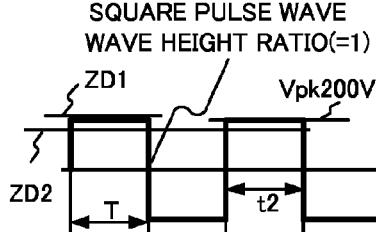 SQUARE PULSE WAVE WAVE HEIGHT RATIO(=1) | t1/T = 0.0<br><br>(t1/T) < FIRST THRESHOLD RATIO(=0.35), an output is determined as 100V | t2/T = 1.0<br><br>(t2/T) > SECOND THRESHOLD RATIO(=0.7), an output is determined as 200V |
| FIG.5D 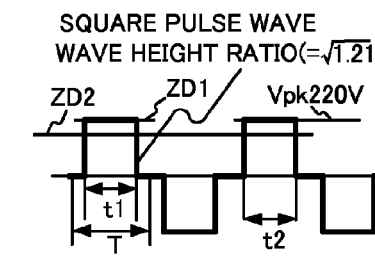 SQUARE PULSE WAVE WAVE HEIGHT RATIO(=√1.21) | t1/T = 0.83<br><br>(t1/T) > FIRST THRESHOLD RATIO(=0.35), an output is determined as 200V | T2/T = 0.83<br><br>(t2/T) > SECOND THRESHOLD RATIO(=0.7), an output is determined as 200V |

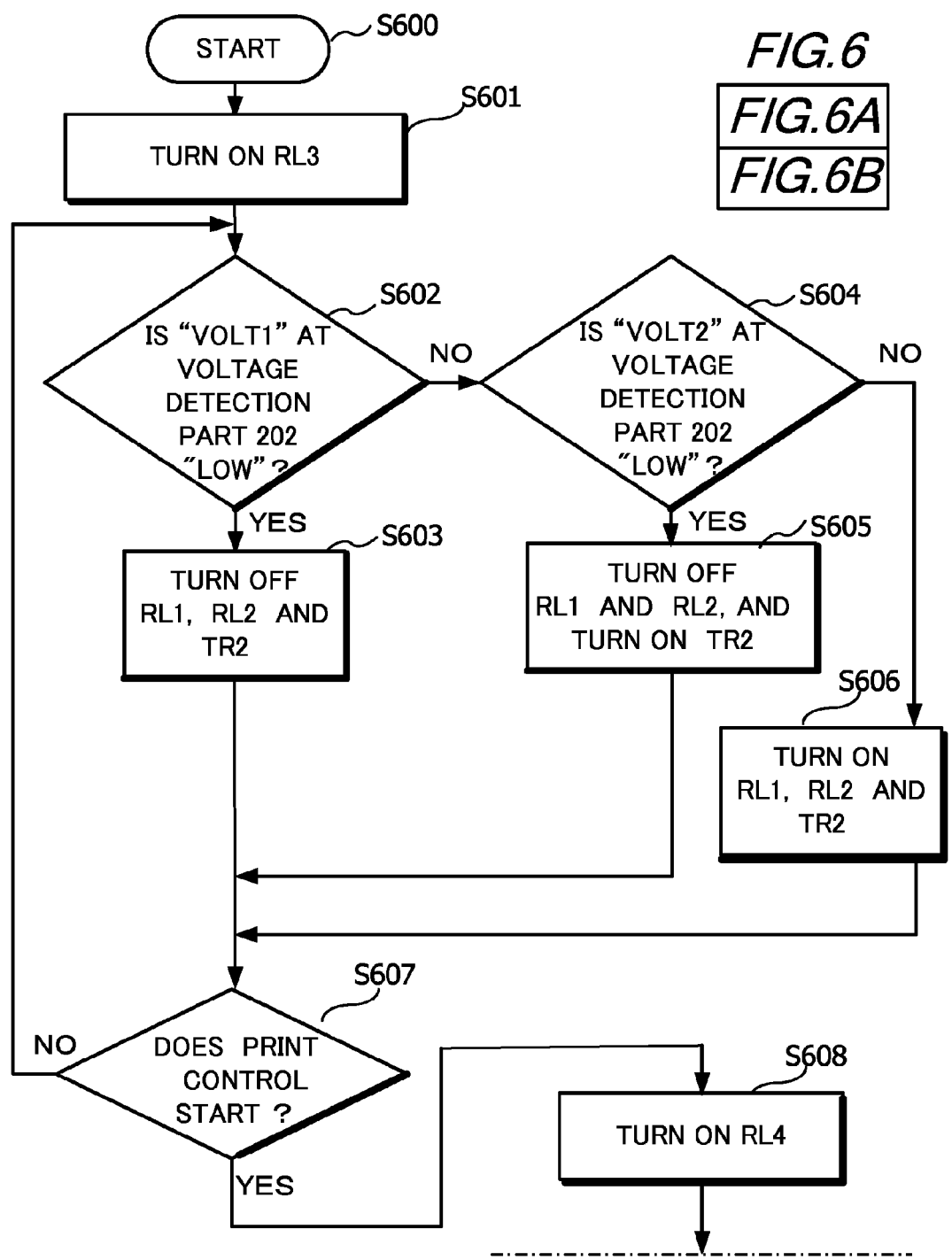

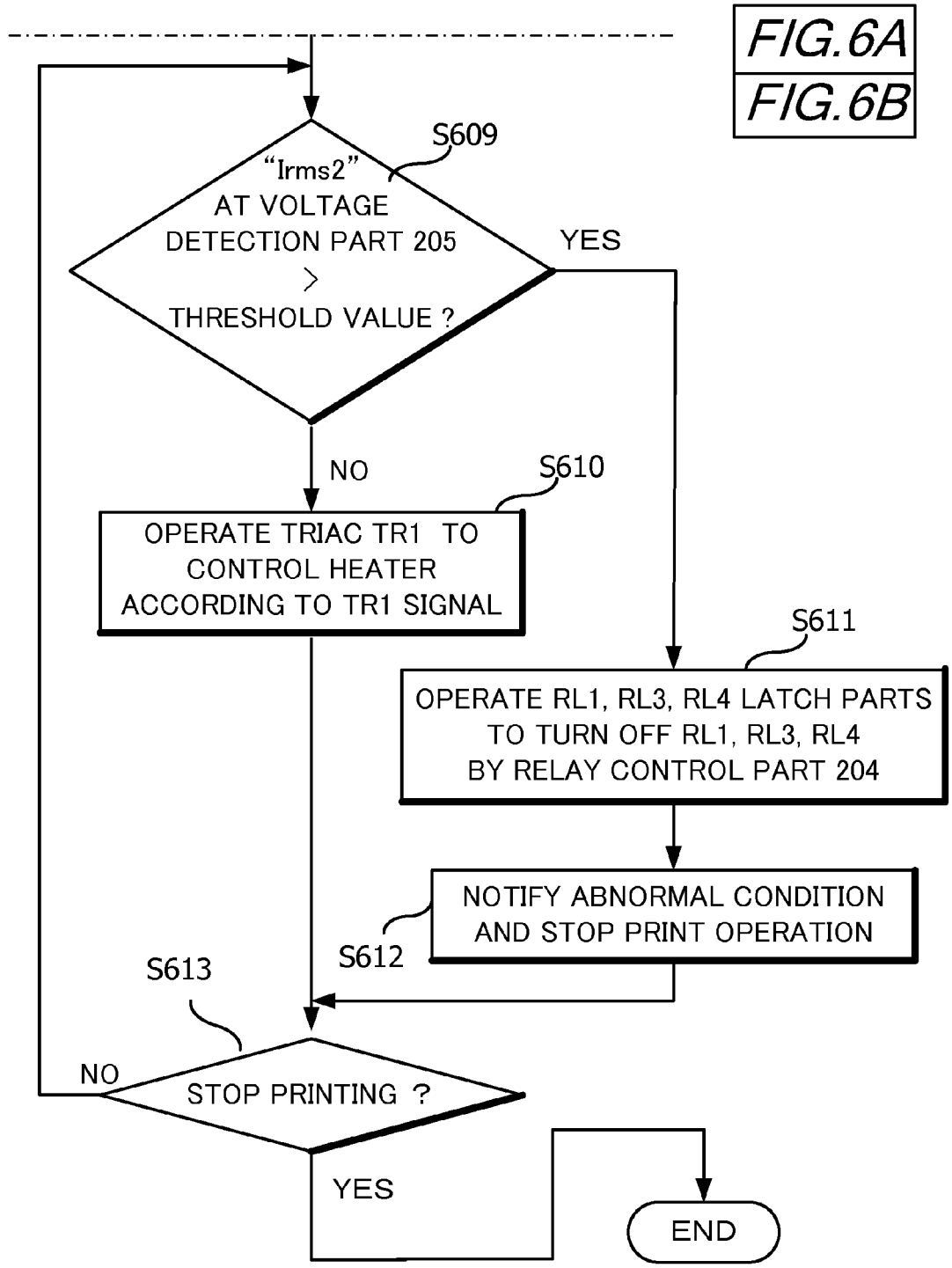

VOLTAGE DETECTION DEVICE AND IMAGE HEATING DEVICE

BACKGROUND OF THE INVENTION

1. Field of the Invention

The present invention relates to a voltage detection device and an image heating device, which are used for an image forming apparatus, for example, a copier or a laser beam printer.

2. Description of the Related Art

A film-heating type image heating device for heat fixing of an image forming apparatus generally uses a heater in which a resistance heating element is formed on a substrate made of ceramics. With respect to the image heating device using the resistance heating element, in many cases, a heater of an image heating device used in an area where a commercial power supply voltage is a 100 V system (for example, 100 V to 127 V, hereinafter the same) has a different resistance value from a heater of an image heating device used in an area where the commercial power supply voltage is a 200 V system (for example, 200 V to 240 V, hereinafter the same). In order to realize a common universal image heating device which may be used in an area where both the commercial power supply voltage of the 100 V system and the commercial power supply voltage of the 200 V system are supplied, a method of changing the resistance value of the heater by using a switch, for example, a relay is proposed. For example, Japanese Patent Application Laid-Open No. H07-199702 or U.S. Pat. No. 5,229,577 describes an image heating device which includes first and second conductive paths in a longitudinal direction of the heater, in which the resistance value is changed between a first operating state where the first conductive path and the second conductive path are connected in series and a second operating state where the first conductive path and the second conductive path are connected in parallel.

In the method of switching between series connection and parallel connection of the two conductive paths as described in Japanese Patent Application Laid-Open No. H07-199702, a relay having a make contact (also called normally open contact) or a break contact (also called normally close contact) and a relay having a break-before-make contact (BBM contact) are used. Instead of the relay having the BBM contact, a relay having two make contacts or a relay having the make contact and the break contact may be used. In the proposed changing method described in U.S. Pat. No. 5,229,577, a relay having two BBM contacts is used. In this method, whether the power supply voltage is the 100 V system or the 200 V system is determined and the conductive paths of the heater are switched between the series connection and the parallel connection. Therefore, the resistance value of the heater may be changed without adjusting a heat generating region.

A known method for realizing a universally adaptable AC/DC converter used for the image forming apparatus is a method of changing a path for charging two electrolytic capacitors provided on a primary side of a transformer to switch between voltage doubler rectification and full-wave rectification. In this method, whether the power supply voltage is the 100 V system or the 200 V system is determined. When the power supply voltage is the 100 V system, the voltage doubler rectification is performed. When the power supply voltage is the 200 V system, the full-wave rectification is performed. Therefore, the voltage applied to the primary side of the transformer may be controlled to obtain a constant value as much as possible.

For example, Japanese Patent Application Laid-Open No. H05-030729 discloses a switching circuit for a rectifying circuit, in which an alternating-current (AC) input voltage is detected by a control circuit, and in response to a switching signal from the control circuit, the voltage doubler rectification of the 100 V system and the full-wave rectification of the 200 V system are switched by a switch element to obtain a constant direct-current (DC) output voltage. The feature of the switching circuit is that a gate element is used as the switch element and a pulse driving signal is generated as a gate element switching signal from the control circuit.

Meanwhile, power supplied to a fixing device which is a resistance load is proportional to a square value of an effective voltage value of the power supply. Therefore, it is desired to determine whether the conductive paths of the heater are to be connected in series or in parallel based on the effective voltage value or the square value thereof. In contrast, the voltage applied to the electrolytic capacitors of the AC/DC converter used for an image forming apparatus is a value close to a peak voltage (peak hold value) of the power supply. Therefore, it is desired to determine whether the power supply is set in the voltage doubler rectification state or the full-wave rectification state based on the peak voltage or quasi-peak voltage of the power supply.

SUMMARY OF THE INVENTION

An object of the present invention is to allow determination of whether an effective voltage value, a peak voltage, and a quasi-peak voltage of an AC power supply voltage are high or low in an image heating device which includes a heater in which a resistance value may be changed and an AC/DC converter capable of switching between voltage doubler rectification and full-wave rectification.

Another object of the present invention is to provide a voltage detection device, including a first voltage detection part that detects whether or not a time period ratio during which a voltage of an AC power supply is equal to or larger than a first threshold value is equal to or larger than a first ratio; and a second voltage detection part that detects whether or not a time period ratio during which the voltage of the AC power supply is lower than the first threshold value and equal to or larger than a second threshold value is equal to or larger than a second ratio higher than the first ratio, wherein said voltage detection device determines whether the voltage of the AC power supply is a first commercial voltage or a second commercial voltage lower than the first commercial voltage by means of a result obtained by the first voltage detection part and a result obtained by the second voltage detection part.

A further object of the present invention is to provide the voltage detection device in which, when the first voltage detection part detects that the ratio of the period during which the AC power supply voltage is equal to or larger than the first threshold value is lower than the first ratio or when the second voltage detection part detects that the ratio of the period during which the AC power supply voltage is equal to or larger than the second threshold value is smaller than the second ratio, the voltage of the AC power supply is determined as the second commercial voltage.

A further object of the present invention is to provide an image heating device for fixing an image formed on a recording material, including: a heater including a first conductive path and a second conductive path; a first switching part for switching between a first operating state in which the first conductive path and the second conductive path of the heater are connected in series and a second operating state in which the first conductive path and the second conductive path are connected in parallel; an AC/DC converter including a second switching part for switching between a voltage doubler rectification state and a full-wave rectification state; and a voltage detection part including a first voltage detection part for detecting whether or not a time period ratio during which a voltage of an AC power supply is equal to or larger than a first threshold value is equal to or larger than a first ratio and a second voltage detection part for detecting whether or not a time period ratio during which the voltage of the AC power supply is lower than the first threshold value and equal to or larger than a second threshold value is equal to or larger than a second ratio higher than the first ratio, in which: when a supplied commercial voltage is detected as a first commercial voltage based on a result obtained by the first voltage detection part, the heater is set in the first operating state by the first switching part and the AC/DC converter is set in the full-wave rectification state by the second switching part; when the supplied commercial voltage is detected as a second commercial voltage based on a result obtained by the first voltage detection part and a result obtained by the second voltage detection part, the heater is set in the second operating state by the first switching part and the AC/DC converter is set in the voltage doubler rectification state by the second switching part; and when the supplied commercial voltage is detected as the second commercial voltage based on the result obtained by the first voltage detection part and when the supplied commercial voltage is detected as the first commercial voltage based on the result obtained by the second voltage detection part, the heater is set in the first operating state by the first switching part and the AC/DC converter is set in the voltage doubler rectification state by the second switching part.

A further object of the present invention is to provide an image heating device for fixing an image formed on a recording material, including: a heater including a first conductive path and a second conductive path; a first switching part for switching between a first operating state in which the first conductive path and the second conductive path of the heater are connected in series and a second operating state in which the first conductive path and the second conductive path are connected in parallel; an AC/DC converter including a second switching part for switching between a voltage doubler rectification state and a full-wave rectification state; and a voltage detection part including: a first voltage detection part for detecting whether or not a time period ratio during which a voltage of an AC power supply is equal to or larger than a first threshold value is equal to or larger than a first ratio; and a second voltage detection part for detecting whether or not a time period ratio during which the voltage of the AC power supply is lower than the first threshold value and equal to or larger than a second threshold value is equal to or larger than a second ratio higher than the first ratio, in which an operation of the first switching part and an operation of the second switching part are controlled based on a result obtained by the first voltage detection part and a result obtained by the second voltage detection part.

Another object of the present invention is to provide an image heating forming apparatus for forming an image on a recording material, including: an image forming part for forming the image on the recording material; a heating part for fixing the image formed on the recording material by a heater including a first conductive path and a second conductive path; a first switching part for switching between a first operating state in which the first conductive path and the second conductive path of the heater are connected in series and a second operating state in which the first conductive path and the second conductive path are connected in parallel; an AC/DC converter including a second switching part for switching between a voltage doubler rectification state and a full-wave rectification state; and a voltage detection part including: a first voltage detection part for detecting whether or not a time period ratio during which a voltage of an AC power supply is equal to or larger than a first threshold value is equal to or larger than a first ratio; and a second voltage detection part for detecting whether or not a time period ratio during which the voltage of the AC power supply is lower than the first threshold value and equal to or larger than a second threshold value is equal to or larger than a second ratio higher than the first ratio, in which an operation of the first switching part and an operation of the second switching part are controlled based on a result obtained by the first voltage detection part and a result obtained by the second voltage detection part.

Further features of the present invention will become apparent from the following description of exemplary embodiments with reference to the attached drawings.

BRIEF DESCRIPTION OF THE DRAWINGS

FIG. 4A illustrates an operation of the voltage detection part in a case where a voltage wave form of an AC power supply 201 is an isosceles triangle wave.

FIG. 4B illustrates an operation of the voltage detection part in a case where the voltage wave form of the AC power supply 201 is a sine wave.

FIG. 4C illustrates an operation of the voltage detection part in a case where the voltage wave form of the AC power supply 201 is a square pulse wave.

FIG. 4D illustrates an operation of the voltage detection part in a case where the voltage wave form of the AC power supply 201 is a square pulse wave having an on-time ratio of 63%.

FIG. 4E illustrates an operation of the voltage detection part in a case where the voltage wave form of the AC power supply 201 is a square pulse wave having an on-time ratio of 33%.

FIG. 5A illustrates an operation of the voltage detection part in a case where the voltage wave form of the AC power supply 201 is an isosceles triangle wave.

FIG. 5B illustrates an operation of the voltage detection part in a case where the voltage wave form of the AC power supply 201 is a sine wave.

FIG. 5C illustrates an operation of the voltage detection part in a case where the voltage wave form of the AC power supply 201 is a square pulse wave.

FIG. 5D illustrates an operation of the voltage detection part in a case where the voltage wave form of the AC power supply 201 is a square pulse wave having an on-time ratio of 83%.

FIG. 6A is a control flowchart for the image heating device according to the first embodiment. FIG. 6 is comprised of FIGS. 6A and 6B.

FIG. 6B is a control flowchart for the image heating device according to the first embodiment. FIG. 6 is comprised of FIGS. 6A and 6B.

DESCRIPTION OF THE EMBODIMENTS

Preferred embodiments of the present invention will now be described in detail in accordance with the accompanying drawings.

Hereinafter, structures and operations in the present invention are described. The following embodiments are examples. Therefore, the technical scope of the present invention is not limited to only the embodiments.

(Fixing Device)

Figure 1:
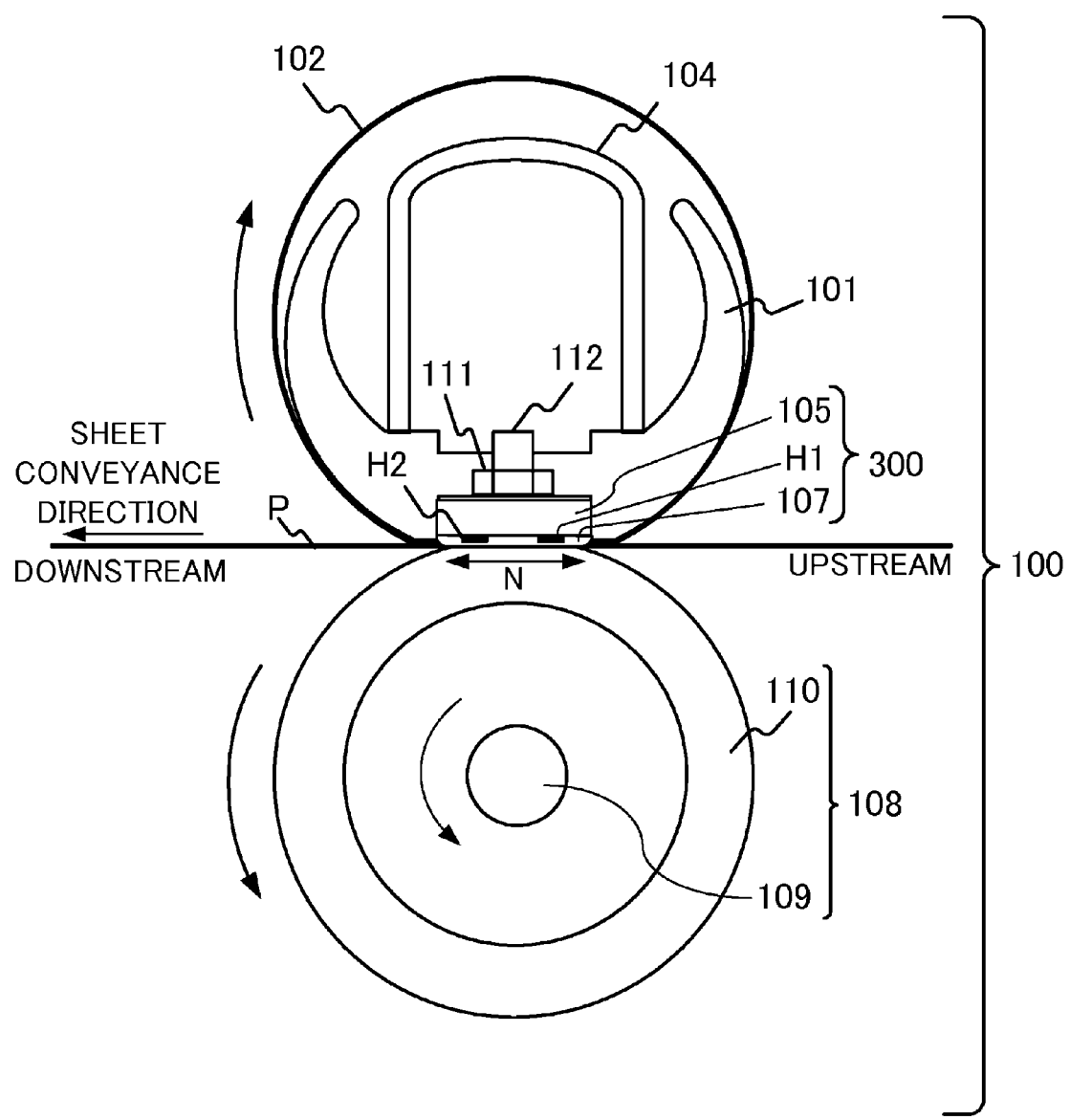
FIG. 1 is a cross sectional view illustrating an image heating device according to a first embodiment of the present invention.

FIG. 1 is a cross sectional view of a fixing device 100 as an example of an image heating device. The fixing device 100 includes a film (endless belt) 102 rolled in a cylindrical shape, a heater 300 that is brought into contact with an inner surface of the film 102, and a pressure roller (nip part forming member) 108. The pressure roller 108 and the heater 300 together form a fixing nip part N through the film 102. The film 102 has a base layer made of a heat-resistant resin such as a polyimide or a metal such as stainless. The pressure roller 108 includes a core metal 109 made of iron, aluminum, or the like and an elastic layer 110 made of silicone rubber or the like. The heater 300 is held by a holding member 101 made of a heat-resistant resin. The holding member 101 also has a guide function of guiding the rotation of the film 102. The pressure roller 108 is powered by a motor (not shown) and rotated in a direction of the arrow. Along with the rotation of the pressure roller 108, the film 102 is rotated accompanying the rotation of the pressure roller 108.

The heater 300 includes a heater substrate 105 made of ceramics, a conductive path H1 (first conductive path) and a conductive path H2 (second conductive path) each formed on the heater substrate by using a heat resistor, and a surface protective layer 107 made of an insulating material covering the first and second conductive paths H1 and H2. The heater substrate 105 has a back surface formed as a sheet feeding area for passing a minimum size sheet (envelop DL size, which is 110 mm in width in this embodiment) set as usable in a printer. A temperature detection element 111 such as a thermistor abuts against the sheet feeding area. According to the temperature detected by the temperature detection element 111, power to be supplied from a commercial alternating current (AC) power supply to a heating line is controlled. A recording material (sheet) P for bearing an unfixed toner image is subjected to fixing processing in the fixing nip part N, in which the recording material P is pinched and conveyed while being heated. An element 112 such as a thermo-switch also abuts against the back surface side of the heater 105. The element 112 is actuated when the heater 300 experiences an abnormal temperature rise, to cut off a power feed line to the heating line. Similarly to the temperature detection element 111, the element 112 also abuts against the sheet feeding area for the minimum size sheet. A metal stay 104 is employed for applying a spring pressure (not shown) to the holding member 101.

Figure 2A:
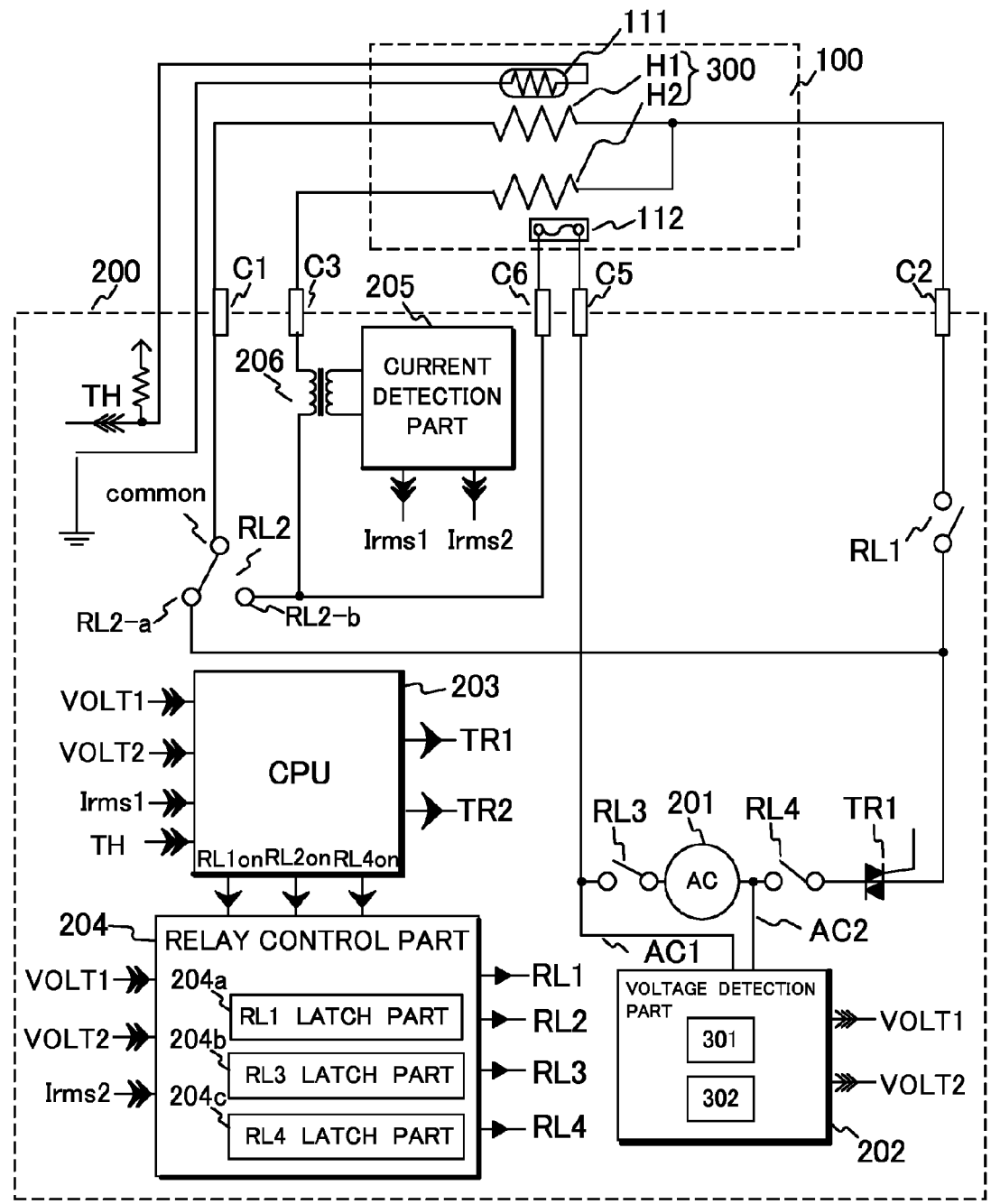
FIG. 2A illustrates a structure of a control circuit in the first embodiment of the present invention.
Figure 2B:
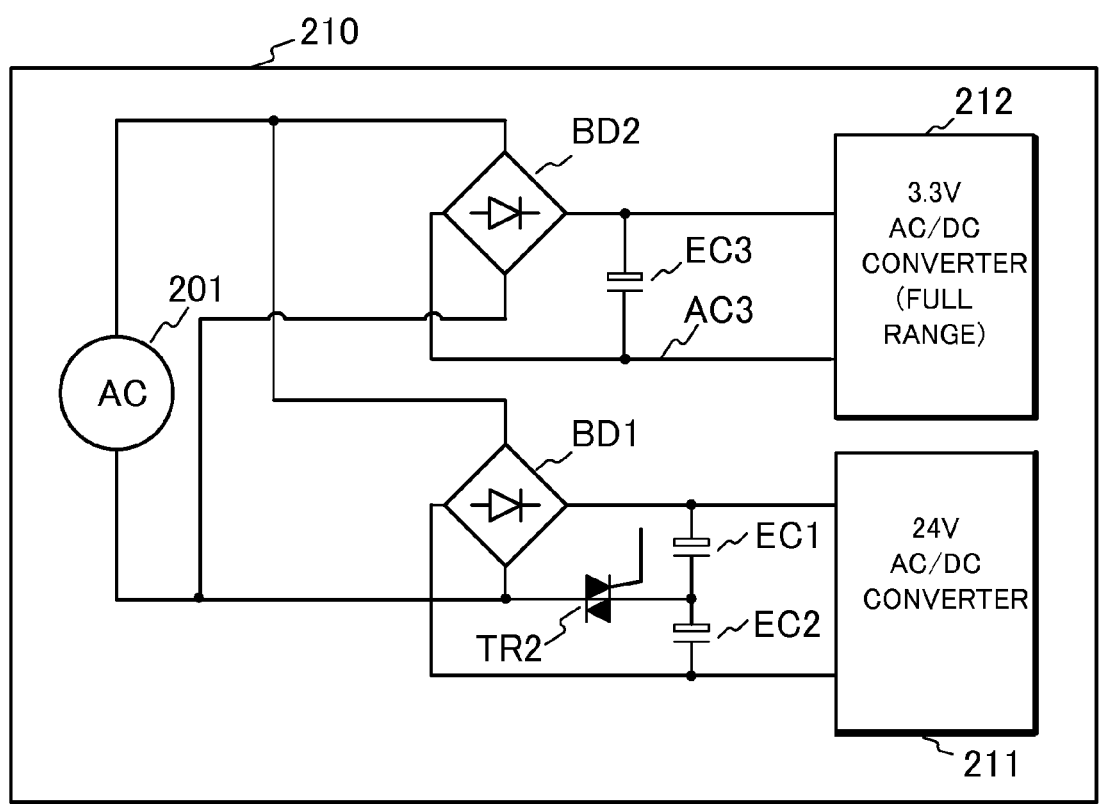
FIG. 2B illustrates a circuit structure of an AC/DC converter in the first embodiment.

A first embodiment is described. FIGS. 2A and 2B illustrate a control circuit 200 for the heater 300 in the first embodiment. FIG. 2A is a circuit block diagram illustrating the control circuit 200 and FIG. 2B illustrates an AC/DC converter 210 of an image forming apparatus. Connectors C1, C2, C3, C5, and C6 are connectors for connecting the control circuit 200 with the fixing device 100. Power supplied from a commercial AC power supply 201 to the heater 300 is controlled by the on/off operation of a bidirectional thyristor (hereinafter referred to as "triac") TR1 (first switching part). The triac TR1 operates in accordance with a signal for driving the heater 300 from a CPU 203. As a circuit (not shown) for driving the triac TR1, a triac driving circuit or a zero cross detection circuit as described in, for example, Japanese Patent Application Laid-Open No. 2007-212503 may be used.

The temperature to be detected by the temperature detection element 111 is detected as a divided-voltage of a pull-up resistor and input as a TH signal to the CPU 203. As the inner processing of the CPU 203, for example, PI control is performed based on the temperature detected by the temperature detection element 111 and a set temperature of the heater 300 so that power to be supplied is calculated and converted into control levels of a phase angle (phase control) and a wave number (wave number control) to control the triac TR1.

Next, a voltage detection part and a relay control part are described. Relays RL1 (first switching unit), RL2 (second switching unit), RL3, and RL4 illustrated in FIG. 2B exhibit contact connection states during a power-off state. When the control circuit 200 becomes a standby state, the relay RL3 simultaneously becomes an on state and a voltage detection part 202 detects a voltage of the AC power supply 201. The voltage detection part 202 determines whether a power supply voltage range is a 100 V system or a 200 V system and outputs, to the CPU 203 and a relay control part 204, a VOLT1 signal and a VOLT2 signal as results of the voltage detection. The voltage detection part 202 includes a voltage detection circuit 301 (which outputs VOLT1 signal) corresponding to a first voltage detection circuit and a voltage detection circuit 302 (which outputs VOLT2 signal) corresponding to a second voltage detection circuit. A voltage detection method is described in detail with reference to FIGS. 3A and 3B, 4A to 4E, 5A to 5D, and 6A and 6B.

A method of switching between series connection and parallel connection of the conductive paths H1 and H2 of the heater 300 is described. When the voltage detection part 202 determines that the range of the effective voltage value of the power supply voltage is the 200 V system (first commercial voltage), the VOLT1 signal or the VOLT2 signal becomes a low state. When the voltage detection part 202 detects the 200 V system, the control circuit 200 causes the relay control part 204 to operate an RL1 latch part 204a, to thereby maintain the relay RL1 in the off state. In a case where the RL1 latch part 204a operates, even when an RL1on signal output from the CPU 203 becomes the high state, the relay RL1 is maintained in the off state. The operation of the relay control part 204 may be implemented by, instead of the latch circuit described above, a hardware circuit for causing the relay RL1 to be in the off state while the VOL1 signal or the VOL2 signal is in the low state. The CPU 203 causes the relay RL2 to be maintained in the off state, based on the results of the voltage detection. The CPU 203 further outputs an RL4on signal in the high state to turn on the relay RL4, thereby entering a state in which power may be supplied to the fixing device 100. In such a state, the conductive path H1 and the conductive path H2 are connected in series (first operating state), and hence the heater 300 is in a high-resistance state.

When the voltage detection part 202 detects that the range of the effective voltage value of the power supply line is the 100 V system (second commercial voltage), the CPU 203 outputs the RL1on signal in the high state so that the relay control part 204 turns on the relay RL1. The CPU 203 outputs an RL2on signal in the high state according to the VOLT1 signal and the VOLT2 signal so that the relay RL2 is turned on (to connect to right contact RL2-b). The relay RL2 is off during the connection with a left contact RL2-a, and is on during the connection with the right contact RL2-b. The CPU 203 further outputs the RL4on signal in the high state to turn on the relay RL4, thereby entering a state in which power may be supplied to the fixing device 100. In such a state, the conductive path H1 and the conductive path H2 are connected in parallel (second operating state), and hence the heater 300 is in a low-resistance state.

FIG. 2B is a schematic diagram illustrating the AC/DC converter 210. The AC/DC converter 210 includes a 24 V AC/DC converter 211 and a 3.3 V AC/DC converter 212. An output of the 24 V AC/DC converter 211 is supplied to drive, for example, a motor of the image forming apparatus. An output of the 3.3 V AC/DC converter 212 is supplied to, for example, the CPU 203, the relay control part 204, and the voltage detection part 202. Power for driving the relay RL3 and a triac TR2 is also supplied from the 3.3 V AC/DC converter 212. The AC/DC converter 210 has two output voltages of 3.3 V and 24 V. The voltage detection circuit according to this embodiment may be applied to an AC/DC converter having a different combination of output voltages and an AC/DC converter having at least three output voltages.

The 24 V AC/DC converter 211 is described. A bridge diode BD1 is used to rectify an AC voltage between a first output and a second output of the AC power supply 201. Smoothing electrolytic capacitors EC1 (first capacitor) and EC2 (second capacitor) are provided. One of the ends of the triac TR2 (second switching unit) is connected to a middle point between the smoothing capacitors EC1 and EC2 and the other end of the triac TR2 is connected to the AC power supply 201. In a full-wave rectification state, the triac TR2 is in the off state, and hence the voltage rectified by the bridge diode BD1 is applied to a combined capacitor obtained by series connection of the smoothing capacitors EC1 and EC2. In a voltage doubler rectification state, the triac TR2 is in the on state. Therefore, a positive-phase half-wave is stored in the smoothing capacitor EC1 and peak-held, and a negative-phase half-wave is stored in the smoothing capacitor EC2 and peak-held. Thus, a voltage substantially two times larger than that of the full-wave rectification state is applied to the 24 V AC/DC converter 211. When the voltage detection part 202 determines that the range of the peak voltage or quasi-peak voltage of the power supply voltage is the 200 V system, the VOLT1 signal becomes the low state. The VOLT1 signal which is in the low state is input to the CPU 203 so that the CPU 203 turns off the triac TR2, and hence the 24 V AC/DC converter 211 becomes the full-wave rectification state. When the voltage detection part 202 determines that the range of the peak voltage or quasi-peak voltage of the power supply voltage is the 100 V system, the VOLT1 signal becomes the high state. The VOLT1 signal which is in the high state is input to the CPU 203 so that the CPU 203 turns on the triac TR2, and hence the 24 V AC/DC converter 211 becomes the voltage doubler rectification state. The 3.3 V AC/DC converter 212 is a converter operable in a full range without depending on whether the range of the power supply voltage is the 100 V system or the 200 V system.

The 3.3 V AC/DC converter 212 is described. A bridge diode BD2 is used to rectify the AC voltage from the AC power supply 201. A smoothing electrolytic capacitor EC3 is provided. The 3.3 V AC/DC converter 212 is used for a power supply for small loads such as a CPU and a sensor. Therefore, even when switching between the voltage doubler rectification and the full-wave rectification is not performed, a converter operable in a full range may be relatively simply designed. In this embodiment, the 24 V AC/DC converter 211 drives a large-load element, for example, a motor, and hence large power output is required. In a case of an AC/DC converter which may output large power and does not include particularly a power factor correction (PFC) circuit, it may be difficult to perform the operation in the full range without switching between the voltage doubler rectification and the full-wave rectification. Thus, in this embodiment, the switching between the voltage doubler rectification and the full-wave rectification is performed in the 24 V AC/DC converter 211.

A current detection part 205 is described. The current detection part 205 detects an effective value of current flowing into the primary side through a current transformer 206. The current detection part 205 outputs an Irms1 signal indicating a square value of the effective value of current for each period of the commercial power supply frequency, and an Irms2 signal indicating a moving average value of the Irms1 signal. The CPU 203 detects the effective value of current for each period of the commercial power supply frequency based on the Irms1 signal. For example, the method proposed in Japanese Patent Application Laid-Open No. 2007-212503 may be used for the current detection part 205. The moving average value (Irms2) is output to the relay control part 204. When an overcurrent flows into the current transformer 206 and thus the moving average value (Irms2) exceeds a predetermined threshold value, the relay control part 204 operates the RL1 latch part 204a, an RL3 latch part 204b, and an RL4 latch part 204c to maintain the relays RL1, RL3, and RL4 in the off state. Therefore, power supply to the fixing device 100 is cut off. In this case, of the latch parts, only the RL3 latch part and the RL4 latch part need to be operated.

Figure 3A:
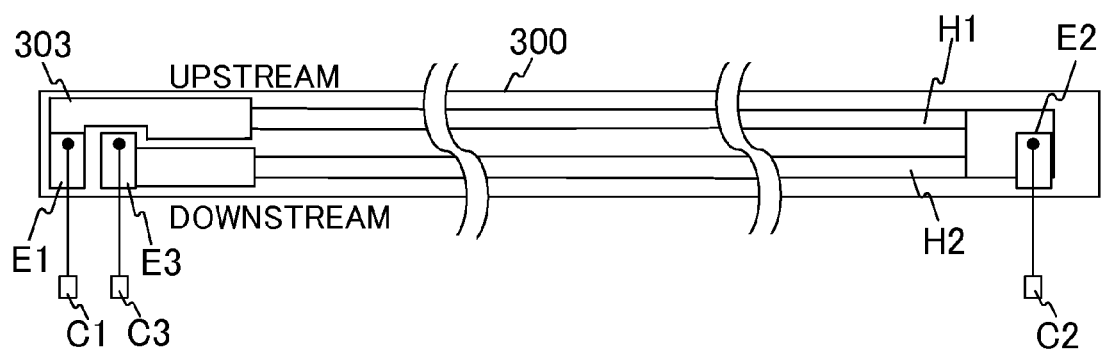
FIG. 3A illustrates a conductive pattern and electrodes of a heater in the first embodiment.
Figure 3B:
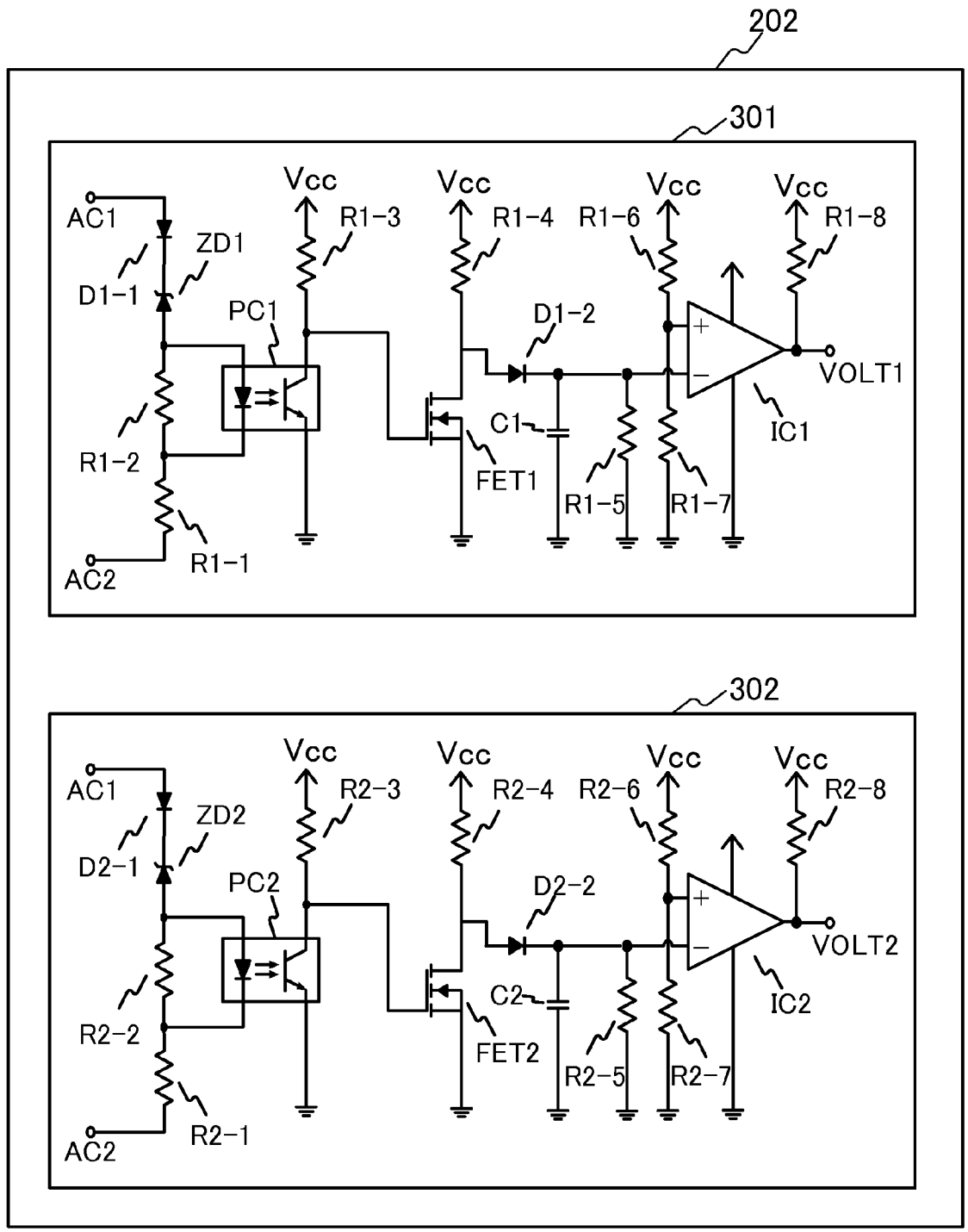
FIG. 3B illustrates a circuit structure of a voltage detection part in the first embodiment.

FIGS. 3A and 3B are schematic diagrams illustrating the heater 300 and the voltage detection part 202 that are used in this embodiment. FIG. 3A illustrates heating patterns, conductive patterns, and electrodes formed on the heater substrate 105. FIG. 3A also illustrates connection parts to the connectors C1, C2, and C3 illustrated in FIG. 2 for describing connection to the control circuit 200 illustrated in FIG. 2. The heater 300 includes the conductive paths H1 and H2 formed by resistance heating patterns. The heater 300 also includes a conductive pattern 303. The conductive path H1 of the heater 300 is supplied with power through an electrode E1 (first electrode) and an electrode E2 (second electrode). The conductive path H2 is supplied with power through the electrode E2 and an electrode E3 (third electrode). The electrode E1 is connected to the connector C1, the electrode E2 is connected to the connector C2, and the electrode E3 is connected to the connector C3.

Figure 9A:
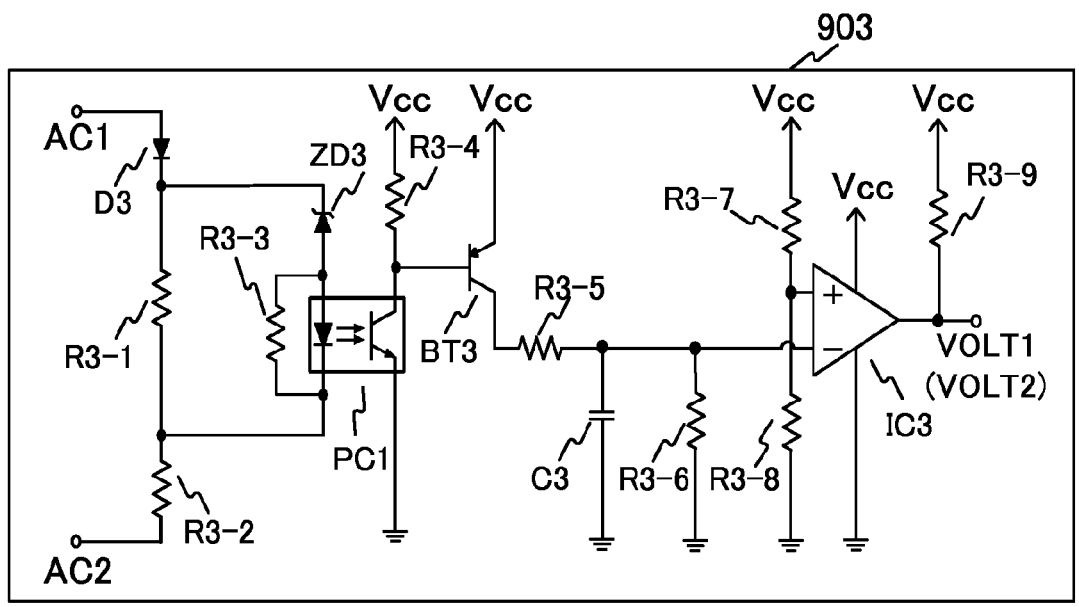
FIG. 9A illustrates a structure of a voltage detection circuit in a third embodiment.
Figure 9B:
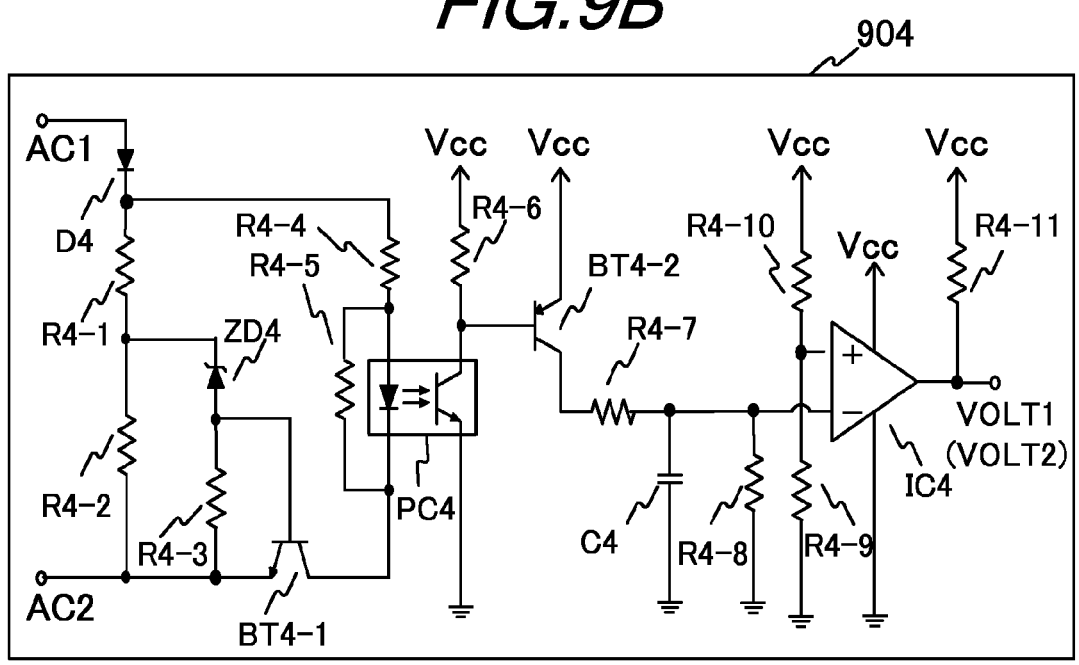
FIG. 9B illustrates a structure of a voltage detection circuit in a third embodiment.
Figure 9C:
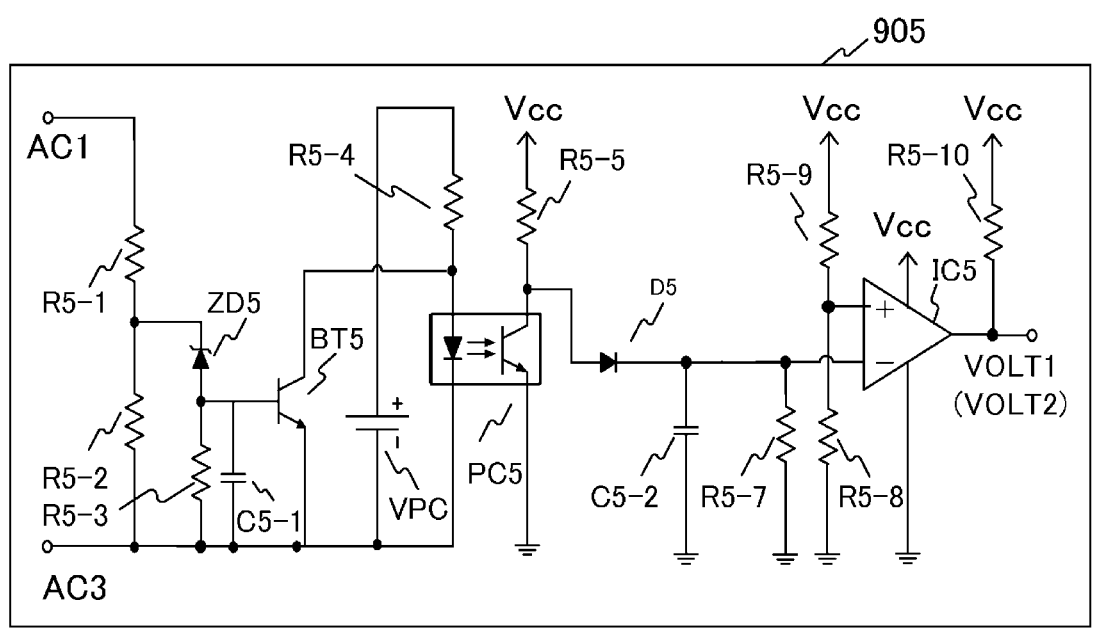
FIG. 9C illustrates a structure of a voltage detection circuit in a third embodiment.

FIG. 3B illustrates the voltage detection circuit 301 and the voltage detection circuit 302 in the voltage detection part 202. The circuit structure illustrated in FIG. 3B is an example of the voltage detection unit. Any of voltage detection circuits as illustrated in FIGS. 9A, 9B, and 9C may be used as the same voltage detection unit. The voltage detection circuits as illustrated in FIGS. 9A, 9B, and 9C are described in a third embodiment.

An operation of a circuit for judging whether a range of an effective value of voltage applied between a first terminal AC1 and a second terminal AC2 of the voltage detection circuit 301 is the 100 V system or the 200 V system is described. When the voltage applied between the first terminal AC1 and the second terminal AC2 is equal to or larger than a threshold value, the voltage applied between the first terminal AC1 and the second terminal AC2 is higher than a Zener voltage of a Zener diode ZD1, and hence a current flows from the first terminal AC1 to the second terminal AC2. A diode D1-1 is a reverse current prevention diode. A resistor R1-1 is a current limiting resistor. A resistor R1-2 is a protection resistor for a photocopier PC1. When a current flows into a primary-side light emitting diode of the photocopier PC1, a secondary-side transistor operates, and hence a current flows from Vcc through a resistor R1-3. Then, a gate voltage of a transistor FET1 becomes a low state, and hence the transistor FET1 is turned off. A charging current flows from Vcc into the capacitor C1 through a resistor R1-4. A diode D1-2 is a reverse current prevention diode. A resistor R1-5 is a discharging resistor. When a time period ratio during which the voltage applied between the first terminal AC1 and the second terminal AC2 is higher than the Zener voltage of the Zener diode ZD1 (on duty) increases, an off time ratio of the transistor FET1 increases. In this embodiment, a threshold value for detecting an AC power supply voltage of the voltage detection circuit 301, which is determined based on the Zener voltage, is defined as a first threshold value. When the off time ratio of the transistor FET1 increases, the period during which the charging current flows from Vcc through the resistor R1-4 increases, and hence the voltage of the capacitor C1 becomes a high value. When the voltage of the capacitor C1 is larger than a comparison voltage of a comparator IC1 which is obtained by voltage division by a resistor R1-6 and a resistor R1-7, a current flows from Vcc into an output part of the comparator IC1 through a resistor R1-8, and hence the voltage of the VOLT1 signal becomes the low state. In this case, a threshold ratio of a period during which a varied voltage exceeds the first threshold value to a half period in the AC power supply voltage is defined as a first ratio. In the circuit diagram for the voltage detection part 202, the Zener diode ZD1 is illustrated as a single element, but multiple Zener diodes may be connected in series depending on power rating. The circuit operation of the voltage detection circuit 302 is the same as in the voltage detection circuit 301 and thus the description thereof is omitted. Similarly, a threshold value for detecting an AC power supply voltage of the voltage detection circuit 302 is defined as a second threshold value. In the voltage detection circuit 302, a threshold ratio of a period during which a varied voltage exceeds the second threshold value to a half period in the AC power supply voltage is defined as a second ratio. A Zener voltage of a Zener diode ZD2 of the voltage detection circuit 302 is lower than the Zener voltage of the Zener diode ZD1. The second threshold value for the voltage detection circuit 302 is lower than the first threshold value. A voltage applied across a charging resistor R2-4 is higher than a voltage applied across the resistor R1-4, and hence the second ratio is higher than the first ratio. This is described in detail with reference to FIGS. 4A to 4E and 5A to 5D.

(Case Where Range of Effective Voltage Value is Determined as 100 V System)

FIGS. 4A to 4E illustrate a method of judging whether the range of the effective voltage value of the AC power supply 201 is the 100 V system or the 200 V system by the voltage detection part 202 used in this embodiment. FIGS. 4A to 4E illustrate the case where the 100 V system is determined. When an AC voltage wave form of 127 V, which is a maximum voltage of the 100 V system, may be determined as the 100 V system, an AC voltage wave form having the same wave form may be determined as the 100 V system. Therefore, the cases of using wave forms of the effective voltage value of 127 V are described. In the following, the determination of the 100 V system may be performed on different voltage wave forms (Crest Factors) of the effective voltage value of 127 V, which is an upper limit voltage of the AC power supply of the 100 V system on the specification.

In the following description, the first threshold value (Zener voltage value of Zener diode ZD1) is set to 220 V, the second threshold value (Zener voltage value of Zener diode ZD2) is set to 160 V, the first ratio is set to 0.35 (35%), and the second ratio is set to 0.7 (70%).

(a) Case Where Voltage Wave Form is Isosceles Triangle Wave

FIG. 4A illustrates a case where the voltage wave form of the AC power supply 201 is an isosceles triangle wave. A Crest Factor of the isosceles triangle wave is $\sqrt{3}$. When the effective voltage value is 127 V, a peak voltage Vpk is 220 V. A ratio (t1/T) of a period during which the voltage value of the AC power supply 201 is equal to or larger than the first threshold value is 0 (0%), and is equal to or smaller than the first ratio, and hence the VOLT1 signal output from the voltage detection circuit 301 is in the high state. Therefore, a low-voltage range (100 V system) is detected. A ratio (t2/T) of a period during which the voltage value of the AC power supply 201 is equal to or larger than the second threshold value is 0.28 (28%), and is equal to or smaller than the second ratio, and hence the VOLT2 signal output from the voltage detection circuit 302 is in the high state. Therefore, the low-voltage range (100 V system) is detected. The isosceles triangle wave illustrated in FIG. 4A is adapted to even a harmonic wave form having a high Crest Factor, for example, a third-order harmonic distortion wave form, and hence the voltage detection part 202 normally operates.

(b) Case Where Voltage Wave Form is Sine Wave

FIG. 4B illustrates a case where the voltage wave form of the AC power supply 201 is a sine wave. A Crest Factor of the sine wave is $\sqrt{2}$. When the effective voltage value is 127 V, the peak voltage Vpk is 180 V. The ratio (t1/T) of the period during which the voltage value of the AC power supply 201 is equal to or larger than the first threshold value is 0 (0%), and is equal to or smaller than the first ratio, and hence the VOLT1 signal output from the voltage detection circuit 301 is in the high state. Therefore, the low-voltage range (100 V system) is detected. The ratio (t2/T) of the period during which the voltage value of the AC power supply 201 is equal to or larger than the second threshold value is 0.30 (30%), and is equal to or smaller than the second ratio, and hence the VOLT2 signal output from the voltage detection circuit 302 is in the high state. Therefore, the low-voltage range (100 V system) is detected. The sine wave illustrated in FIG. 4B is adapted to even an AC power supply voltage wave form with no distortion, and hence the voltage detection part 202 normally operates.

(c) Case Where Voltage Wave Form is Square Pulse Wave

FIG. 4C illustrates a case where the voltage wave form of the AC power supply 201 is a square pulse wave. A Crest Factor of the square pulse wave is 1. When the effective voltage value is 127 V, the peak voltage Vpk is 127 V. The ratio (t1/T) of the period during which the voltage value of the AC power supply 201 is equal to or larger than the first threshold value is 0 (0%), and is equal to or smaller than the first ratio, and hence the VOLT1 signal output from the voltage detection circuit 301 is in the high state. Therefore, the low-voltage range (100 V system) is detected. The ratio (t2/T) of the period during which the voltage value of the AC power supply 201 is equal to or larger than the second threshold value is 0 (0%), and is equal to or smaller than the second ratio, and hence the VOLT2 signal output from the voltage detection circuit 302 is in the high state. Therefore, the low-voltage range (100 V system) is detected. In this case, an output of an uninterruptible power supply (UPS) provided with no sine wave output function is assumed. The square pulse wave illustrated in FIG. 4C is adapted to even a square pulse wave having a minimum Crest Factor, and hence the voltage detection part 202 normally operates.

(d) Case Where Voltage Wave Form is Square Pulse Wave Having On-Time Ratio of 63%

FIG. 4D illustrates a case where the voltage wave form of the AC power supply 201 is a square pulse wave having an on-time ratio of 63%. A Crest Factor of the square pulse wave is $\sqrt{(1.58)}$. When the effective voltage value is 127 V, the peak voltage Vpk is 160 V. The ratio (t1/T) of the period during which the voltage value of the AC power supply 201 is equal to or larger than the first threshold value is 0 (0%), and is equal to or smaller than the first ratio, and hence the VOLT1 signal output from the voltage detection circuit 301 is in the high state. Therefore, the low-voltage range (100 V system) is detected. The ratio (t2/T) of the period during which the voltage value of the AC power supply 201 is equal to or larger than the second threshold value is 0.63 (63%), and is equal to or smaller than the second ratio, and hence the VOLT2 signal output from the voltage detection circuit 302 is in the high state. Therefore, the low-voltage range (100 V system) is detected. In this case, the output of the uninterruptible power supply (UPS) provided with no sine wave output function is assumed. The square pulse wave illustrated in FIG. 4D is a square pulse wave having a peak voltage equal to or larger than the second threshold value and has a wave form having a minimum Crest Factor (high on-time ratio).

(e) Case Where Voltage Wave Form is Square Pulse Wave Having On-Time Ratio of 33%

FIG. 4E illustrates a case where the voltage wave form of the AC power supply 201 is a square pulse wave having an on-time ratio of 33%. A Crest Factor of the square pulse wave is $\sqrt{3}$. When the effective voltage value is 127 V, the peak voltage Vpk is 220 V. The ratio (t1/T) of the period during which the voltage value of the AC power supply 201 is equal to or larger than the first threshold value is 0.33 (33%), and is equal to or smaller than the first ratio, and hence the VOLT1 signal output from the voltage detection circuit 301 is in the high state. Therefore, the low-voltage range (100 V system) is detected. The ratio (t2/T) of the period during which the voltage value of the AC power supply 201 is equal to or larger than the second threshold value is 0.33 (33%), and is equal to or smaller than the second ratio, and hence the VOLT2 signal output from the voltage detection circuit 302 is in the high state. Therefore, the low-voltage range (100 V system) is detected. In this case, the output of the uninterruptible power supply (UPS) provided with no sine wave output function is assumed. The square pulse wave illustrated in FIG. 4E is a square pulse wave having a voltage value equal to or larger than the second threshold value and has a wave form having a minimum Crest Factor (high on-time ratio).

(Case Where Range of Effective Voltage Value is Determined as 200 V System)

FIGS. 5A to 5D illustrate a method of judging whether the voltage range of the AC power supply 201 is the 100 V system or the 200 V system by the voltage detection part 202 used in this embodiment. FIGS. 5A to 5D illustrate the case where the voltage wave form of the 200 V system is determined. When an AC voltage wave form having an effective voltage value of 200 V, which is a minimum voltage of the 200 V system, may be determined as the 200 V system, an AC voltage wave form having the same wave form with the effective voltage value larger than 200 V may be determined as the 200 V system. Therefore, the cases of using wave forms of the effective voltage value of 200 V are described. In the following, the determination of the 200 V system may be performed on different voltage wave forms (Crest Factors) of the effective voltage value of 200 V, which is a lower limit voltage of the AC power supply of the 200 V system on the specification.

(a) Case Where Voltage Wave Form is Isosceles Triangle Wave

FIG. 5A illustrates a case where the voltage wave form of the AC power supply 201 is an isosceles triangle wave. A Crest Factor of the isosceles triangle wave is $\sqrt{3}$. When the effective voltage value is 200 V, a peak voltage Vpk is 346 V. A ratio (t1/T) of a period during which the voltage value of the AC power supply 201 is equal to or larger than the first threshold value is 0.36 (36%), and is equal to or larger than the first ratio, and hence the VOLT1 signal output from the voltage detection circuit 301 is in the low state. Therefore, a high-voltage range (200 V system) is detected. A ratio (t2/T) of a period during which the voltage value of the AC power supply 201 is equal to or larger than the second threshold value is 0.54 (54%), and is equal to or smaller than the second ratio, and hence the VOLT2 signal output from the voltage detection circuit 302 is in the high state. Therefore, the low-voltage range (100 V system) is detected. When any one of the voltage detection circuit 301 and the voltage detection circuit 302 detects the high-voltage state, the voltage detection part 202 determines that the effective voltage value of the AC power supply voltage is in a state of 200 V. In FIG. 5A, the voltage detection circuit 301 detects the voltage state of 200 V, and hence the voltage detection part 202 may detect a high-effective voltage state.

(b) Case Where Voltage Wave Form is Sine Wave

FIG. 5B illustrates a case where the voltage wave form of the AC power supply 201 is a sine wave. A Crest Factor of the sine wave is $\sqrt{2}$. When the effective voltage value is 200 V, the peak voltage Vpk is 282 V. The ratio (t1/T) of the period during which the voltage value of the AC power supply 201 is equal to or larger than the first threshold value is 0.43 (43%), and is equal to or larger than the first ratio, and hence the VOLT1 signal output from the voltage detection circuit 301 is in the low state. Therefore, the high-voltage range (200 V system) is detected. The ratio (t2/T) of the period during which the voltage value of the AC power supply 201 is equal to or larger than the second threshold value is 0.61 (61%), and is equal to or smaller than the second ratio, and hence the VOLT2 signal output from the voltage detection circuit 302 is in the high state. Therefore, the low-voltage range (100 V system) is detected. In FIG. 5B, the voltage detection circuit 301 detects the voltage state of 200 V, and hence the voltage detection part 202 may detect a high-effective voltage state.

(c) Case Where Voltage Wave Form is Square Pulse Wave

FIG. 5C illustrates a case where the voltage wave form of the AC power supply 201 is a square pulse wave. A Crest Factor of the square pulse wave is 1. When the effective voltage value is 200 V, the peak voltage Vpk is 200 V. The ratio (t1/T) of the period during which the voltage value of the AC power supply 201 is equal to or larger than the first threshold value is 0 (0%), and is equal to or smaller than the first ratio, and hence the VOLT1 signal output from the voltage detection circuit 301 is in the high state. Therefore, the low-voltage range (100 V system) is detected. The ratio (t2/T) of the period during which the voltage value of the AC power supply 201 is equal to or larger than the second threshold value is 1 (100%), and is equal to or larger than the second ratio, and hence the VOLT2 signal output from the voltage detection circuit 302 is in the low state. Therefore, the high-voltage range (200 V system) is detected. In FIG. 5C, the voltage detection circuit 302 detects the voltage state of 200 V, and hence the voltage detection part 202 may detect a high-effective voltage state.

(d) Case Where Voltage Wave Form is Square Pulse Wave Having On-Time Ratio of 83%

FIG. 5D illustrates a case where the voltage wave form of the AC power supply 201 is a square pulse wave having an on-time ratio of 83%. A Crest Factor of the square pulse wave is $\sqrt{(1.21)}$. When the effective voltage value is 200 V, the peak voltage Vpk is 220 V. The ratio (t1/T) of the period during which the voltage value of the AC power supply 201 is equal to or larger than the first threshold value is 0.83 (83%), and is equal to or larger than the first ratio, and hence the VOLT1 signal output from the voltage detection circuit 301 is in the low state. Therefore, the high-voltage range (200 V system) is detected. The ratio (t2/T) of the period during which the voltage value of the AC power supply 201 is equal to or larger than the second threshold value is 0.83 (83%), and is equal to or larger than the second ratio, and hence the VOLT2 signal output from the voltage detection circuit 302 is in the low state. Therefore, the high-voltage range (200 V system) is detected. In this case, the output of the uninterruptible power supply (UPS) provided with no sine wave output function is assumed. The square pulse wave illustrated in FIG. 5D is a square pulse wave having a voltage value equal to or smaller than the first threshold value and has a wave form having a maximum Crest Factor (low on-time ratio).

As described above, the two voltage detection circuits 301 and 302 of the voltage detection part 202 are used, and hence whether the effective voltage value of each of the triangle wave having the high Crest Factor, the sine wave, and the multiple square pule waves having the different Crest Factor is in the low-voltage range of the 100 V system or the high-voltage range of the 200 V system may be determined. In this embodiment, the first threshold value, the first ratio, the second threshold value, and the second ratio are set corresponding to the wave forms illustrated in FIGS. 4A to 4E and 5A to 5D, but may be adjusted to suitable set values depending on corresponding wave forms.

As described above, the voltage applied to the smoothing capacitors EC1 and EC2 of the 24 V AC/DC converter 211 is a peak hold wave form obtained by rectifying the AC power supply voltage. Therefore, when the 24 V AC/DC converter 211 is to be controlled so that the input voltage thereof is a constant value and the voltage applied to the smoothing capacitors EC1 and EC2 does not exceed a rating voltage of the capacitors, the control is desirably performed based on the peak voltage or quasi-peak voltage of the AV power supply voltage. In this embodiment, when the 24 V AC/DC converter 211 is controlled, the state of the smoothing capacitors EC1 and EC2 is switched between the full-wave rectification state and the voltage doubler rectification state in response to the VOLT1 signal output from the voltage detection circuit 301 having the first threshold value which is the high voltage threshold and the first ratio which is the low ratio threshold. When the voltage detection part 202 determines that the range of the peak voltage or quasi-peak voltage of the power supply voltage is the 200 V system based on the VOLT1 signal, the VOLT1 signal becomes the low state. Then, the triac TR2 is turned off, and hence the 24 V AC/DC converter 211 becomes the full-wave rectification state. When the voltage detection part 202 determines that the range of the peak voltage or quasi-peak voltage of the power supply voltage is the 100 V system based on the VOLT1 signal, the triac TR2 is turned on, and hence the 24 V AC/DC converter 211 becomes the voltage doubler rectification state.

FIGS. 6A and 6B are flow charts illustrating a control sequence of the fixing device 100 which is executed by the CPU 203 and the relay control part 204 in this embodiment. When the control circuit 200 becomes the standby state, control starts to perform processing of Step S601. In Step S601, the relay control part 204 turns on the relay RL3 with the power of the 3.3 V AC/DC converter 212. In Step S602, the range of the AC power supply voltage is determined based on the VOLT1 signal output from the voltage detection part 202. When the VOLT1 signal is "low", that is, when the AC power supply voltage is determined to be in the high-voltage range (200 V system), processing proceeds to Step S603. When the AC power supply voltage is determined to be in the low-voltage range (100 V system), processing proceeds to Step S604. In Step S603, the relay RL1 and the relay RL2 are brought into the off state (series connection state of resistors) and the triac TR2 is brought into the off state (full-wave rectification state). In Step S604, the range of the AC power supply voltage is determined based on the VOLT2 signal output from the voltage detection part 202. When the VOLT2 signal is "low", that is, when the AC power supply voltage is determined to be in the high-voltage range (200 V system), processing proceeds to Step S605. When the AC power supply voltage is determined to be in the low-voltage range (100 V system), processing proceeds to Step S606. In Step S605, the relay RL1 and the relay RL2 are brought into the off state (series connection state of resistors) and the triac TR2 is brought into the on state (voltage doubler rectification state). In Step S606, the relay RL1 and the relay RL2 are brought into the on state (parallel connection state of resistors) and the triac TR2 is brought into the on state (voltage doubler rectification state).

Until the start of print control is determined in Step S607, processings of Steps S602 to S606 are repeated. When the print control is started, processing proceeds to Step S608. In Step S608, the relay RL4 is turned on to be able to supply power to the heater 300. In Step S609, whether or not an overcurrent flows is determined based on the Irms2 signal output from the current detection part 205. When the moving average value (Irms2) is determined to be larger than a threshold value, that is, when the current detection part 205 detects the overcurrent, processing proceeds to Step S611. In Step S611, the relay control part 204 operates the RL1, RL3, and RL4 latch parts to maintain the relays RL1, RL3, and RL4 in the off state, and processing proceeds to Step S612. In Step S612, an abnormal condition is notified and the print operation is rapidly stopped to complete the control. In Step S609, when the moving average value (Irms2) is determined to be equal to or smaller than the threshold value, that is, when the abnormal condition is not detected, processing proceeds to Step S610. In Step S610, the CPU 203 PI-controls the triac TR1 based on the TH signal from the temperature detection element 111 and the Irms1 signal from the current detection part 205, to perform the control of power supplied to the heater 300 (as phase control or wave number control), and hence the temperature of the heater is controlled. For example, a known method described in Japanese Patent No. 3919670 may be used as a method of limiting the current supplied to the heater based on the Irms1 signal from the current detection part 205. Until the end of print is determined in Step S613, processings of Steps S609 to S612 are repeated. When the end of print is determined, the control is completed.

As described above, whether the effective voltage value, peak voltage, and quasi-peak voltage of the AC power supply voltage are high or low may be determined in the image heating device including the heater in which the resistance value may be changed and the AC/DC converter capable of switching between the voltage doubler rectification and the full-wave rectification.

Figure 7:
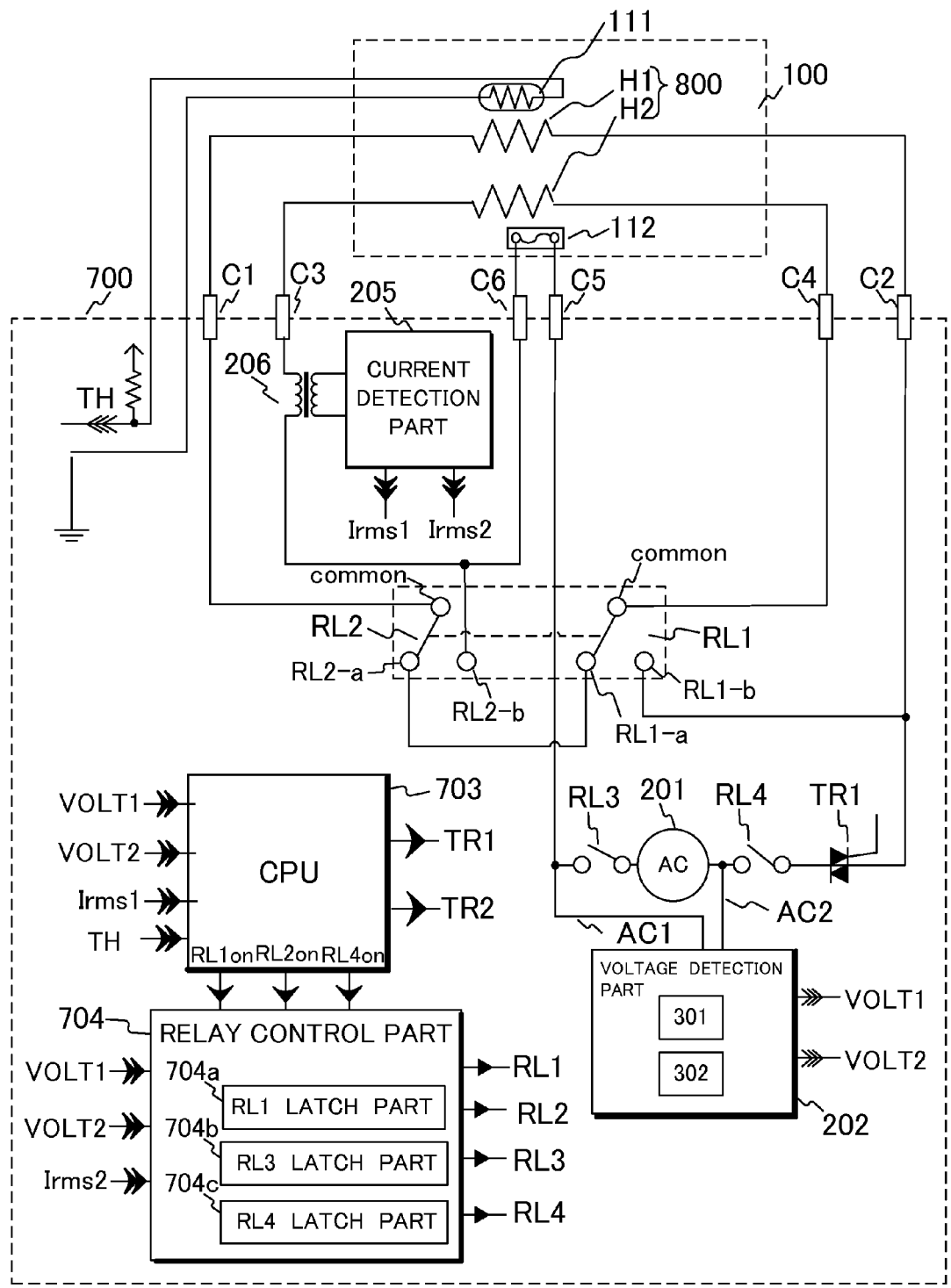
FIG. 7 illustrates a structure of a control circuit in a second embodiment.

Next, a second embodiment is described. The second embodiment relates to another example of the method of switching between the series connection and parallel connection of the conductive paths H1 and H2, which is described in the first embodiment. The description of the same structure as in the first embodiment is omitted. FIG. 7 illustrates a control circuit 700 for a heater 800 in this embodiment.

Hereinafter, the voltage detection part and the relay control part are described. FIG. 7 illustrates contact connection states of the relays RL1, RL2, RL3, and RL4 during the power-off state. When the voltage detection part 202 determines that the range of the effective voltage value of the power supply voltage is the 200 V system, the VOLT1 signal or the VOLT2 signal becomes the low state. A relay control part 704 operates an RL1 latch part 704a to maintain the relay RL1 in the off state. There is a feature that the relay RL2 operates in conjunction with the relay RL1, and hence the relay RL2 becomes the off state simultaneously with the off state of the relay RL1. Further, when the relay RL4 is turned on, the heater 800 may be supplied with power. In this state, the conductive path H1 and the conductive path H2 are connected in series, and hence the heater 800 is in the high-resistance state. When the voltage detection part 202 determines that the range of the effective voltage value of the power supply voltage is the 100 V system, the VOLT1 signal and the VOLT2 signal become the high state. The relay control part 704 causes the relay RL1 to be in the on state. The relay RL2 operates in conjunction with the relay RL1, and hence the relay RL2 becomes the on state simultaneously with the on state of the relay RL1. Further, when the relay RL4 is turned on, the fixing device 100 may be supplied with power. In this state, the conductive path H1 and the conductive path H2 are connected in parallel, and hence the heater 800 is in the low-resistance state.

Figure 8:
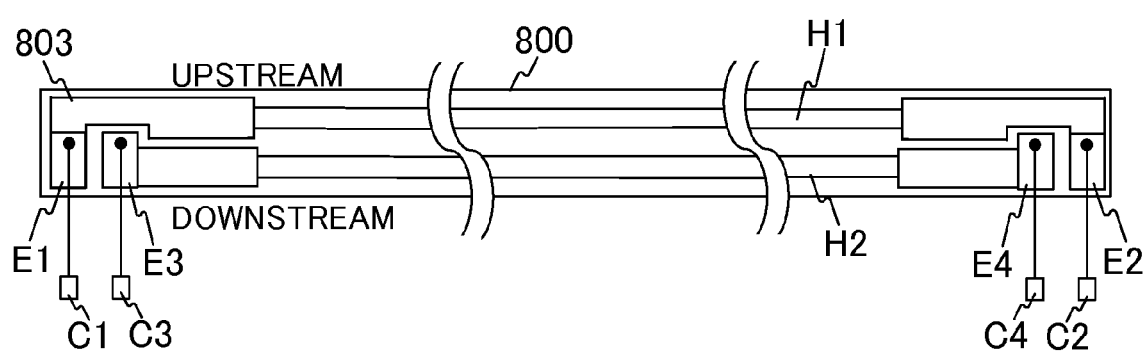
FIG. 8 illustrates a conductive pattern and electrodes of a heater in the second embodiment.

FIG. 8 is a schematic view illustrating the heater 800 used in this embodiment. FIG. 8 illustrates a heating pattern, a conductive pattern, and electrodes, which are formed on the heater substrate 105. FIG. 8 also illustrates portions connected to the connectors C1 to C4 illustrated in FIG. 7 to describe connection to the control circuit 700 illustrated in FIG. 7. The heater 800 includes the conductive paths H1 and H2 formed as resistance heating patterns. A conductive pattern 803 is provided. The conductive path H1 of the heater 800 is supplied with power through the electrode E1 (first electrode) and the electrode E2 (second electrode). The conductive path H2 of the heater 800 is supplied with power through the electrode E3 (third electrode) and an electrode E4 (fourth electrode). The electrode E1 is connected to the connector C1. The electrode E2 is connected to the connector C2. The electrode E3 is connected to the connector C3. The electrode E4 is connected to a connector C4. Even in the case of the method of switching between the series connection and parallel connection of the conductive paths H1 and H2 using the relay having two break-before-make contacts (BBM contacts), which is described in the first embodiment, this embodiment is applicable.

As described above, whether the effective voltage value, peak voltage, and quasi-peak voltage of the AC power supply voltage are high or low may be determined in the image heating device including the heater in which the resistance value may be changed and the AC/DC converter capable of switching between the voltage doubler rectification and the full-wave rectification.

Next, a third embodiment is described. The third embodiment relates to other examples of the voltage detection circuits 301 and 302 of the first embodiment. The description of the same structure as in the first embodiment is omitted. Voltage detection circuits 903, 904, and 905 illustrated in FIGS. 9A to 9C are examples of the voltage detection circuit which may be applied in the first and second embodiments.

A circuit operation of the voltage detection circuit 903 is described. When the voltage applied between the terminals AC1 and AC2 is equal to or larger than a threshold value, a dividing voltage obtained by a resistor R3-1 and a resistor R3-2 is higher than a Zener voltage of a Zener diode ZD3. Therefore, a current flows into a primary-side light emitting diode of a photocopier PC3. A diode D3 is a reverse current prevention diode. A resistor R3-3 is a protection resistor for the photocopier PC3. When a current flows into a primary-side light emitting diode of the photocopier PC3, a secondary-side transistor operates, and hence a current flows from Vcc through a resistor R3-4. Then, a gate voltage of a pnp type bipolar transistor BT3 becomes a low state. When the pnp type bipolar transistor BT3 becomes an on state, a charging current flows from Vcc into a capacitor C3 through a resistor R3-5. A resistor R3-6 is a discharging resistor. When the voltage applied between the terminals AC1 and AC2 increases and thus a time period ratio during which the current flows into the primary-side light emitting diode of the photocopier PC3 (on duty) increases, a period during which the charging current flows into the capacitor C3 increases, and hence a voltage of the capacitor C3 becomes a high value. When the voltage of the capacitor C3 is larger than a comparison voltage of a comparator IC3 which is obtained by voltage division by a resistor R3-7 and a resistor R3-8, a current flows from Vcc into an output part of the comparator IC3 through a resistor R3-9. Then, the voltage of the VOLT1 (VOLT2) signal becomes the low state. In the voltage detection circuit 903, the resistors R3-1 and R3-2 for voltage division are used to reduce power consumed by the Zener diode ZD3, and hence a Zener diode having low power rating may be provided. In the case of the voltage detection circuit 903, a threshold value for detecting the AC power supply voltage, which is determined based on the dividing voltage obtained by the resistors R3-1 and R3-2 and the Zener voltage of the Zener diode ZD3, is defined as the first threshold value (second threshold value). Even in the cases of the voltage detection circuits 904 and 905, the first threshold value (second threshold value) is determined based on the dividing voltage obtained by the resistors and the Zener voltage.

A circuit operation of the voltage detection circuit 904 is described. When the voltage applied between the terminals AC1 and AC2 is equal to or larger than the threshold value, a dividing voltage obtained by a resistor R4-1 and a resistor R4-2 is higher than a Zener voltage of a Zener diode ZD4. Then, when a voltage is applied across a resistor R4-3, an npn type bipolar transistor BT4-1 is turned on, and hence a current flows into a primary-side light emitting diode of a photocopier PC4 through a resistor R4-4. A diode D4 is a reverse current prevention diode. A resistor R4-5 is a protection resistor for the photocopier PC4. When a current flows into a primary-side light emitting diode of the photocopier PC4, a secondary-side transistor operates, and hence a current flows from Vcc through a resistor R4-6. Then, a gate voltage of a pnp type bipolar transistor BT4-2 becomes a low state. When the pnp type bipolar transistor BT4-2 becomes an on state, a charging current flows from Vcc into a capacitor C4 through a resistor R4-7. A resistor R4-8 is a discharging resistor. When the voltage applied between the terminals AC1 and AC2 increases and thus a time period ratio during which the current flows into the primary-side light emitting diode of the photocopier PC4 (on duty) increases, a period during which the charging current flows into the capacitor C4 increases, and hence a voltage of the capacitor C4 becomes a high value. When the voltage of the capacitor C4 is larger than a comparison voltage of a comparator 1C4 which is obtained by voltage division by a resistor R4-9 and a resistor R4-10, a current flows from Vcc into an output part of the comparator IC4 through a resistor R4-11. Then, the voltage of the VOLT1 (VOLT2) signal becomes the low state. The bipolar transistor BT4-1 is used in the voltage detection circuit 904, and hence the rising and falling responses of the current flowing into the primary-side light emitting diode of the photocopier PC4 are rapid. Therefore, the AC power supply voltage may be detected with high precision.

A circuit operation of the voltage detection circuit 905 is described. There is a feature that the voltage detection circuit 905 detects a voltage applied between the terminal AC1 and a terminal AC3. When the voltage at the terminal AC1 is larger than the voltage at the terminal AC2, the terminal AC3 is connected to the terminal AC2 through the bridge diode BD2 (FIG. 2B), and hence substantially the same effect as in the case where the voltage between the terminals AC1 and AC2 is detected may be obtained. The bridge diode BD2 serves also as a reverse current prevention diode. In the voltage detection circuit 905, the voltage between the terminals AC1 and AC3 is detected to use an auxiliary winding voltage (VPC) described later. When the voltage applied between the terminals AC1 and AC3 is equal to or larger than the threshold value, a dividing voltage obtained by a resistor R5-1 and a resistor R5-2 is higher than a Zener voltage of a Zener diode ZD5. Then, when a voltage is applied across a resistor R5-3, an npn type bipolar transistor BT5 is turned on, and hence a primary-side light emitting diode of a photocopier PC5 becomes a short-circuit state. The power supply VPC is a DC power supply produced by a transformer auxiliary winding voltage (not shown) of the 3.3 V AC/DC converter 212. A current flows from the power supply VPC into the primary-side light emitting diode of the photocopier PC5 through a resistor R5-4. While the npn type bipolar transistor BT5 is in the off state, the primary-side light emitting diode of the photocopier PC5 is in a current supply state. When the voltage applied between the terminals AC1 and AC3 increases, the npn type bipolar transistor BT5 is turned on, and hence the primary-side light emitting diode of the photocopier PC5 is short-circuited and becomes a non-light emission state. A capacitor C5-1 is a capacitor for noise protection. When the light emitting diode of the photocopier PC5 becomes the non-light emitting state, a secondary-side transistor is turned off, and hence a charging current flows from Vcc into a capacitor C5-2 through a resistor R5-5. A diode D5 is a reverse current prevention diode, and a resistor R5-7 is a discharging resistor. When the voltage applied between the terminals AC1 and AC3 increases and thus a time period ratio during which the primary-side light emitting diode of the photocopier PC5 is in the off state increases, a period during which the charging current flows into the capacitor C5-2 increases, and hence a voltage of the capacitor C5-2 becomes a high value. When the voltage of the capacitor C5-2 is larger than a comparison voltage of a comparator IC5 which is obtained by voltage division by a resistor R5-8 and a resistor R5-9, a current flows from Vcc into an output part of the comparator IC5 through a resistor R5-10. Then, the voltage of the VOLT1 (VOLT2) signal becomes the low state. The npn type bipolar transistor BT5 of the voltage detection circuit 905 is connected in parallel to the primary-side light emitting diode of the photocopier PC5, and hence a bipolar transistor may be used, which has a lower collector-emitter withstanding voltage than the bipolar transistor BT4-1 of the voltage detection circuit 904. The auxiliary winding voltage (VPC) lower than the AC power supply voltage is used, and hence power consumption of the resistors used for the circuit may be reduced as compared with the voltage detection circuits 903 and 904. As described with reference to FIGS. 9A to 9C, the voltage detection circuits 903, 904, and 905 may be applied to the voltage detection part 202 in the present invention.

As described above, there may be provided a voltage detection technology in which whether the effective voltage value, peak voltage, and quasi-peak voltage of the AC power supply voltage are high or low is determined in the image heating device including the heater in which the resistance value may be changed and the AC/DC converter capable of switching between the voltage doubler rectification and the full-wave rectification.

Figure 10:
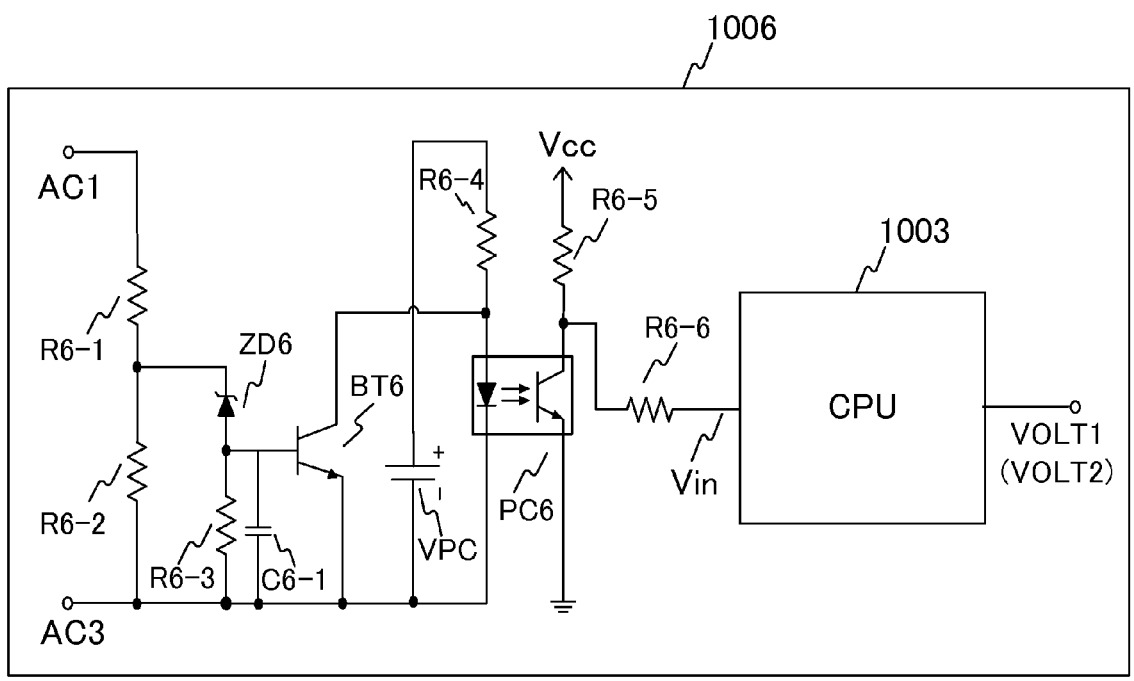
FIG. 10 illustrates a structure of a voltage detection circuit in a fourth embodiment.

Next, a fourth embodiment is described. The fourth embodiment relates to another example of the voltage detection part 202 of the first embodiment. The description of the same structure as in the first embodiment is omitted. A voltage detection circuit 1006 illustrated in FIG. 10 has the same primary-side circuit structure as in the voltage detection circuit 905 illustrated in FIG. 9C and the description thereof is omitted. A signal from a photocopier PC6 is output as a Vin signal to a CPU 1003 through a resistor R6-5 and a resistor R6-6. The CPU may be a microcomputer. When the CPU 1003 calculates a time period ratio during which the Vin signal is "high", a time period ratio during which the AC power supply voltage exceeds the threshold value may be obtained. The voltage detection circuit 1006 may be applied to the voltage detection part 202 in the present invention.

As described above, whether the effective voltage value, peak voltage, and quasi-peak voltage of the AC power supply voltage are high or low may be determined in the image heating device including the heater in which the resistance value may be changed and the AC/DC converter capable of switching between the voltage doubler rectification and the full-wave rectification.

<Example of Image Forming Apparatus to Which Fixing Device (Image Heating Device) Described Above is Applied>

An operation of a laser beam printer which is an example of an image forming apparatus including the fixing device according to any of the first to fourth embodiments is described.

Figure 11:
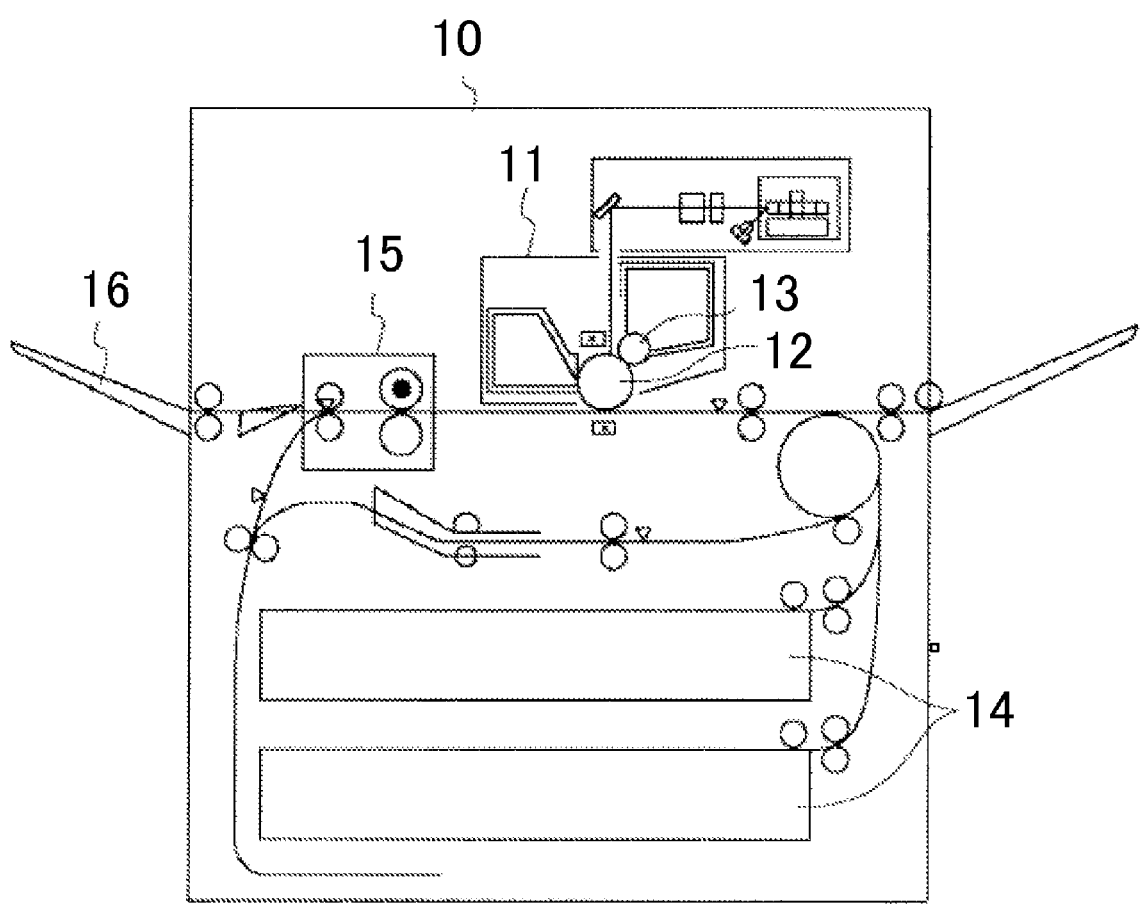
FIG. 11 illustrates a structure of an image forming apparatus.

FIG. 11 is a schematic structural view illustrating the laser beam printer. In FIG. 11, a recording material is supplied from a cassette 14 serving as a recording material containing portion. An electrostatic latent image is formed on a photosensitive drum of an image forming portion 11. The formed electrostatic latent image is developed with toner by a developing unit 13 to form an image on the photosensitive drum. The recording material is transported while the image formed on the photosensitive drum is transferred onto the supplied recording material. The image transferred onto the recording material is heated and pressurized by a fixing device 15 to fix the image on the recording material. After that, the recording material on which the image is fixed is delivered to a delivery tray 16. Such a series of image forming operations are controlled by a controller (not illustrated) based on a program stored in advance. The structure described in any of the first to fourth embodiments may be applied as the fixing device 15 illustrated in FIG. 11. A fixing device which is universally adapted to laser beam printers and has higher safety and an image forming apparatus including the fixing device may be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-110520, filed May 12, 2010, and No. 2011-089378, filed Apr. 13, 2011, which are hereby incorporated by reference herein in their entirety.

What is claimed is:

1. A voltage detection device comprising:
   a first voltage detection part that detects a first ratio that is a ratio of a time period to one cycle of an alternative voltage of an AC power supply to a time period in which the alternative voltage is equal to or more than a first threshold value;
   a second voltage detection part that detects a second ratio that is a ratio of a second time period to the one cycle of the alternative voltage of the AC power supply to a second time period in which the alternative voltage is equal to or more than a second threshold value and less than the first threshold value; and
   a voltage determination unit that determines whether the voltage of the AC power supply is a first commercial voltage or a second commercial voltage lower than the first commercial voltage based on the first ratio and the second ratio,
   wherein in a case where the first ratio is less than the first threshold value and the second ratio is less than the second threshold value, the voltage determination unit determines that the voltage of the AC power supply is the second commercial voltage, and
   in a case where the first ratio is more than the first threshold value and the second ratio is more than the second threshold value, the voltage determination unit determines that the voltage of the AC power supply is the first commercial voltage.

2. A voltage detection device according to claim 1, wherein even if a peak voltage or a quasi-peak voltage of a wave form of the voltage of the AC power supply varies, the voltage determination unit determines whether the voltage of the AC power supply is the first commercial voltage or the second commercial voltage.

3. A voltage detection device according to claim 1, wherein each of the first voltage detection part and the second voltage detection part comprises a capacitor element,
   wherein the first voltage detection part detects a voltage stored in the capacitor element thereof to detect a time period ratio during which the voltage of the AC power supply is equal to or larger than the first threshold value, and
   wherein the second voltage detection part detects a voltage stored in the capacitor element thereof to detect a time period ratio during which the voltage of the AC power supply is equal to or larger than the second threshold value.

4. A voltage detection device according to claim 1, wherein each of the first voltage detection part and the second voltage detection part comprises a Zener diode, and
   wherein the first threshold value is a voltage set by the Zener diode of the first voltage detection part and the second threshold value is a voltage set by the Zener diode of the second voltage detection part.

5. A voltage detection device according to claim 1, wherein the first voltage detection part detects whether the voltage of the AC power supply is equal to or larger than the first threshold value based on a voltage obtained by resistance-dividing the voltage of the AC power supply, and
   wherein the second voltage detection part detects whether the voltage of the AC power supply is equal to or larger than the second threshold value based on a voltage obtained by resistance-dividing the voltage of the AC power supply.

6. A voltage detection device according to claim 1, wherein each of the first voltage detection part and the second voltage detection part includes:
   a Zener diode, a photocopier including a primary-side light emitting diode, and a transistor connected in series to the primary-side light emitting diode,
   wherein in a case where a divided-voltage, which is obtained by dividing the voltage of the AC power supply according to resistances, becomes higher than a Zener voltage of the Zener diode, the transistor is turned on to cause a current to flow into the primary-side light emitting diode, and the voltage determination unit determines whether the voltage of the AC power supply is equal to or larger than the first threshold value or equal to or larger than the second threshold value.

7. A voltage detection device according to claim 1, wherein each of the first voltage detection part and the second voltage detection part includes:
   a Zener diode;
   a photocopier including a primary-side light emitting diode;
   a transistor connected in parallel to the primary-side light emitting diode; and
   a DC power supply,
   wherein in a case where (i) a current is supplied from the DC power supply to the primary-side light emitting diode of the photocopier and (ii) a voltage, which is obtained by resistance-dividing the voltage of the AC power supply, becomes higher than a Zener voltage of the Zener diode, the transistor is turned on to cut off a current supplied to the primary-side light emitting diode, and the voltage determination unit determines whether the voltage of the AC power supply is equal to or larger than the first threshold value or equal to or larger than the second threshold value.

8. An image heating device that fixes an image formed on a recording material, comprising:
   a heater including a first conductive path and a second conductive path;
   a first switching part that switches between (i) first operating state in which the first conductive path and the second conductive path of the heater are connected in series and (ii) a second operating state in which the first conductive path and the second conductive path are connected in parallel;
   an AC/DC converter including a second switching part for switching between a voltage doubler rectification state and a full-wave rectification state; and
   a voltage detection part including:
     a first voltage detection part that detects whether or not a time period ratio during which a voltage of an AC power supply is equal to or larger than a first threshold value is equal to or larger than a first ratio; and
     a second voltage detection part that detects whether or not a time period ratio during which the voltage of the AC power supply is lower than the first threshold value and equal to or larger than a second threshold value is equal to or larger than a second ratio higher than the first ratio, wherein in a case where a supplied commercial voltage is detected as a first commercial voltage based on a result obtained by the first voltage detection part and a result obtained by the second voltage detection part, the heater is set in the first operating state by the first switching part and the AC/DC converter is set in the full-wave rectification state by the second switching part;

wherein in a case where the supplied commercial voltage is detected as a second commercial voltage based on a result obtained by the first voltage detection part and a result obtained by the second voltage detection part, the heater is set in the second operating state by the first switching part and the AC/DC converter is set in the voltage doubler rectification state by the second switching part; and wherein in a case where the supplied commercial voltage is detected as the second commercial voltage based on the result obtained by the first voltage detection part and when the supplied commercial voltage is detected as the first commercial voltage based on the result obtained by the second voltage detection part, the heater is set in the first operating state by the first switching part and the AC/DC converter is set in the voltage doubler rectification state by the second switching part.

9. An image heating device according to claim 8, wherein the heater further comprises a first electrode, a second electrode, and a third electrode, wherein the image heating device further comprises a first switch and a second switch; and wherein the first conductive path is connected between the first electrode and the second electrode, the second conductive path is connected between the second electrode and the third path, the third electrode is connected to a first terminal of the AC power supply, the second electrode is connected to a second terminal of the AC power supply through the first switch, and the first electrode is connected to one of a first power supply voltage terminal and a second power supply voltage terminal through the second switch.

10. An image heating device according to claim 9, further comprising:

an endless belt;

the heater which is in contact with an inner surface of the endless belt; and a nip portion forming member that forms a nip portion with the heater through the endless belt, wherein a recording medium that bears an image is heated while the recording medium is nipped by the nip portion and conveyed.

11. An image heating device according to claim 8, wherein the heater further comprises a first electrode, a second electrode, a third electrode, and a fourth electrode, wherein the image heating device further comprises a first switch and a second switch; and wherein the first conductive path is connected between the first electrode and the second electrode, the second conductive path is connected between the third electrode and the fourth electrode, the third electrode is connected to a first terminal of the AC power supply, the fourth electrode is connected to a second power supply voltage terminal through the first switch, the second electrode is connected to a second terminal of the AC power supply, the first electrode is connected to a first power supply voltage terminal through the second switch, and the first electrode and the fourth electrode are connected to each other through the first switch and the second switch.

12. An image heating device according to claim 11, further comprising:

an endless belt;

the heater which is in contact with an inner surface of the endless belt; and a nip portion forming member that forms a nip portion with the heater through the endless belt, wherein a recording medium that bears an image is heated while the recording medium is nipped by the nip portion and conveyed.

13. An image heating device according to claim 8, wherein the AC/DC converter further comprises:

a rectifying part including a bridge diode, for rectifying an AC voltage between a first output and a second output of the AC power supply;

a first capacitor and a second capacitor which are connected in series to store an output of the rectifying part; and a middle point between the first capacitor and the second capacitor, which is connected to one of the first output and the second output of the AC power supply through the second switching part.

14. An image heating device according to claim 13, further comprising:

an endless belt;

the heater which is in contact with an inner surface of the endless belt; and a nip portion forming member that forms a nip portion with the heater through the endless belt, wherein a recording medium that bears an image is heated while the recording medium is nipped by the nip portion and conveyed.

15. An image heating device according to claim 13, further comprising another AC/DC converter capable of operating without switching between the voltage doubler rectification state and the full-wave rectification state for the first commercial voltage and the second commercial voltage.

16. An image heating device according to claim 15, further comprising:

an endless belt;

the heater which is in contact with an inner surface of the endless belt; and a nip portion forming member that forms a nip portion with the heater through the endless belt, wherein a recording medium that bears an image is heated while the recording medium is nipped by the nip portion and conveyed.

17. An image heating device according to claim 8, further comprising:

an endless belt;

the heater which is in contact with an inner surface of the endless belt; and a nip portion forming member that forms a nip portion with the heater through the endless belt, wherein a recording medium that bears an image is heated while the recording medium is nipped by the nip portion and conveyed.

18. An image heating device for fixing an image formed on a recording material, comprising:

a heater including a first conductive path and a second conductive path;

a first switching part that switches between a first operating state in which the first conductive path and the second conductive path of the heater are connected in series and a second operating state in which the first conductive path and the second conductive path are connected in parallel;

an AC/DC converter including a second switching part for switching between a voltage doubler rectification state and a full-wave rectification state; and a voltage detection part including:

a first voltage detection part that detects whether or not a time period ratio during which a voltage of an AC power supply is equal to or larger than a first threshold value is equal to or larger than a first ratio; and a second voltage detection part that detects whether or not a time period ratio during which the voltage of the AC power supply is lower than the first threshold value and equal to or larger than a second threshold value is equal to or larger than a second ratio higher than the first ratio, wherein an operation of the first switching part and an operation of the second switching part are controlled based on a result obtained by the first voltage detection part and a result obtained by the second voltage detection part.

19. An image forming apparatus for forming an image on a recording material, comprising:

an image forming part that forms the image on the recording material;

a heating part that fixes the image formed on the recording material by a heater including a first conductive path and a second conductive path;

a first switching part that switches between a first operating state in which the first conductive path and the second conductive path of the heater are connected in series and a second operating state in which the first conductive path and the second conductive path are connected in parallel;

an AC/DC converter including a second switching part for switching between a voltage doubler rectification state and a full-wave rectification state; and a voltage detection part including:

a first voltage detection part that detects whether or not a time period ratio during which a voltage of an AC power supply is equal to or larger than a first threshold value is equal to or larger than a first ratio; and a second voltage detection part that detects whether or not a time period ratio during which the voltage of the AC power supply is lower than the first threshold value and equal to or larger than a second threshold value is equal to or larger than a second ratio higher than the first ratio, wherein an operation of the first switching part and an operation of the second switching part are controlled based on a result obtained by the first voltage detection part and a result obtained by the second voltage detection part.

* * * * *